United States Patent
Tsau et al.

(10) Patent No.: US 11,038,029 B2
(45) Date of Patent: Jun. 15, 2021

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Hsueh-Wen Tsau, Miaoli County (TW); Chun-I Wu, Taipei (TW); Ziwei Fang, Hsinchu (TW); Huang-Lin Chao, Hillsboro, OR (US); I-Ming Chang, ShinChu (TW); Chung-Liang Cheng, Changhua County (TW); Chih-Cheng Lin, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/277,262

(22) Filed: Feb. 15, 2019

(65) Prior Publication Data
US 2020/0152746 A1 May 14, 2020

Related U.S. Application Data

(60) Provisional application No. 62/757,291, filed on Nov. 8, 2018.

(51) Int. Cl.
*H01L 29/40* (2006.01)
*H01L 29/78* (2006.01)
(Continued)

(52) U.S. Cl.
CPC ...... *H01L 29/401* (2013.01); *H01L 21/28247* (2013.01); *H01L 21/76831* (2013.01);
(Continued)

(58) Field of Classification Search
CPC ............... H01L 29/6681; H01L 29/401; H01L 29/4941; H01L 29/4958; H01L 29/4966; H01L 29/4975; H01L 29/785; H01L 29/42392; H01L 29/66795; H01L 23/52352; H01L 23/53266; H01L 23/21; H01L 23/28088; H01L 23/28568;
(Continued)

(56) References Cited

U.S. PATENT DOCUMENTS 6,958,500 B2 * 10/2005 Saito ..................... H01L 29/495
257/288
9,209,247 B2 12/2015 Colinge et al.
(Continued)

*Primary Examiner* — Jose R Diaz
(74) *Attorney, Agent, or Firm* — Birch, Stewart, Kolasch & Birch, LLP

(57) ABSTRACT

A method for forming a semiconductor device structure is provided. The method includes providing a substrate and an insulating layer over the substrate. The insulating layer has a trench partially exposing the substrate. The method includes forming a gate dielectric layer in the trench. The method includes forming a first metal-containing layer over the gate dielectric layer. The method includes forming a silicon-containing layer over the first metal-containing layer. The method includes forming a second metal-containing layer over the silicon-containing layer. The method includes forming a gate electrode layer in the trench and over the second metal-containing layer.

20 Claims, 23 Drawing Sheets

(51) Int. Cl.
*H01L 21/768* (2006.01)
*H01L 23/532* (2006.01)
*H01L 23/522* (2006.01)
*H01L 29/423* (2006.01)
*H01L 29/49* (2006.01)
*H01L 21/28* (2006.01)
*H01L 29/66* (2006.01)
*H01L 21/285* (2006.01)
*H01L 29/06* (2006.01)

(52) U.S. Cl.
CPC .. *H01L 21/76843* (2013.01); *H01L 23/53223* (2013.01); *H01L 23/53252* (2013.01); *H01L 23/53266* (2013.01); *H01L 29/42392* (2013.01); *H01L 29/4966* (2013.01); *H01L 29/66795* (2013.01); *H01L 29/785* (2013.01); *H01L 21/28088* (2013.01); *H01L 21/28568* (2013.01); *H01L 23/5226* (2013.01); *H01L 29/0673* (2013.01)

(58) Field of Classification Search
CPC ......... H01L 23/28247; H01L 23/76843; H01L 23/76831
See application file for complete search history.

(56) References Cited

U.S. PATENT DOCUMENTS

| | | |
|---|---|---|
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,659,937 B2 * | 5/2017 | Chang ................. H01L 27/0922 |
| 10,290,638 B1 * | 5/2019 | Chen ................. H01L 27/10885 |
| 2014/0264480 A1 * | 9/2014 | Tsao ................. H01L 21/76834 257/288 |

\* cited by examiner

SEMICONDUCTOR DEVICE STRUCTURE AND METHOD FOR FORMING THE SAME

PRIORITY CLAIM AND CROSS-REFERENCE

This application claims the benefit of U.S. Provisional Application No. 62/757,291, filed on Nov. 8, 2018, and entitled "Conductive structure with low resistivity and method for forming the same", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
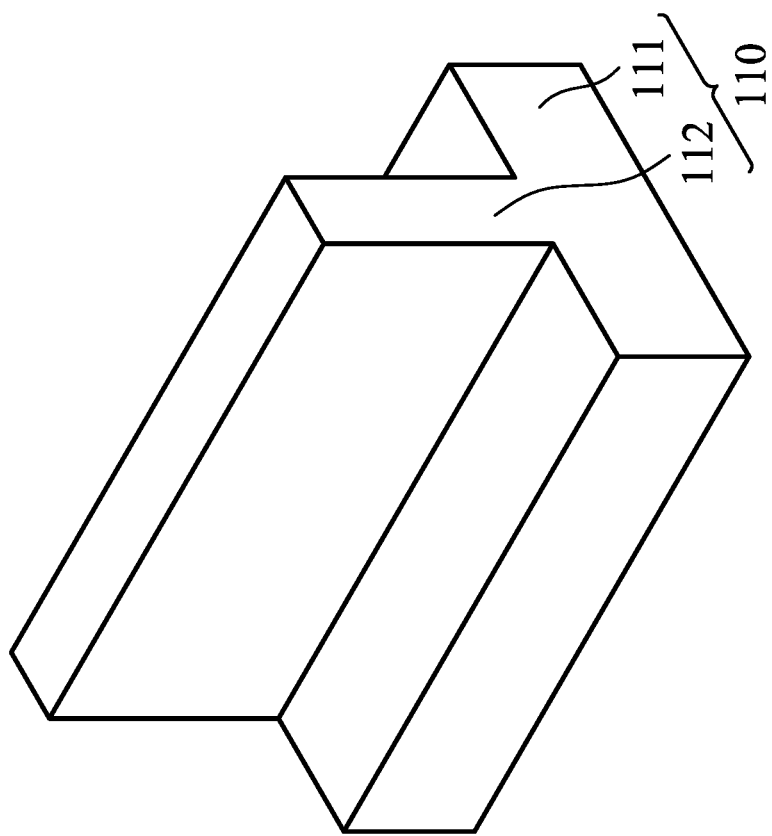
FIGS. 1A-1F are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1A-1F are perspective views of various stages of a process for forming a semiconductor device structure, in accordance with some embodiments. As shown in FIG. 1A, a substrate 110 is provided, in accordance with some embodiments. The substrate 110 includes, for example, a semiconductor substrate. The semiconductor substrate includes, for example, a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof.

The substrate 110 may also include multi-layer semiconductors, semiconductor on insulator (SOI) (such as silicon on insulator or germanium on insulator), or a combination thereof. As shown in FIG. 1A, the substrate 110 has a base 111 and a fin structure 112, in accordance with some embodiments. The fin structure 112 is over the base 111, in accordance with some embodiments.

Figure 1B:
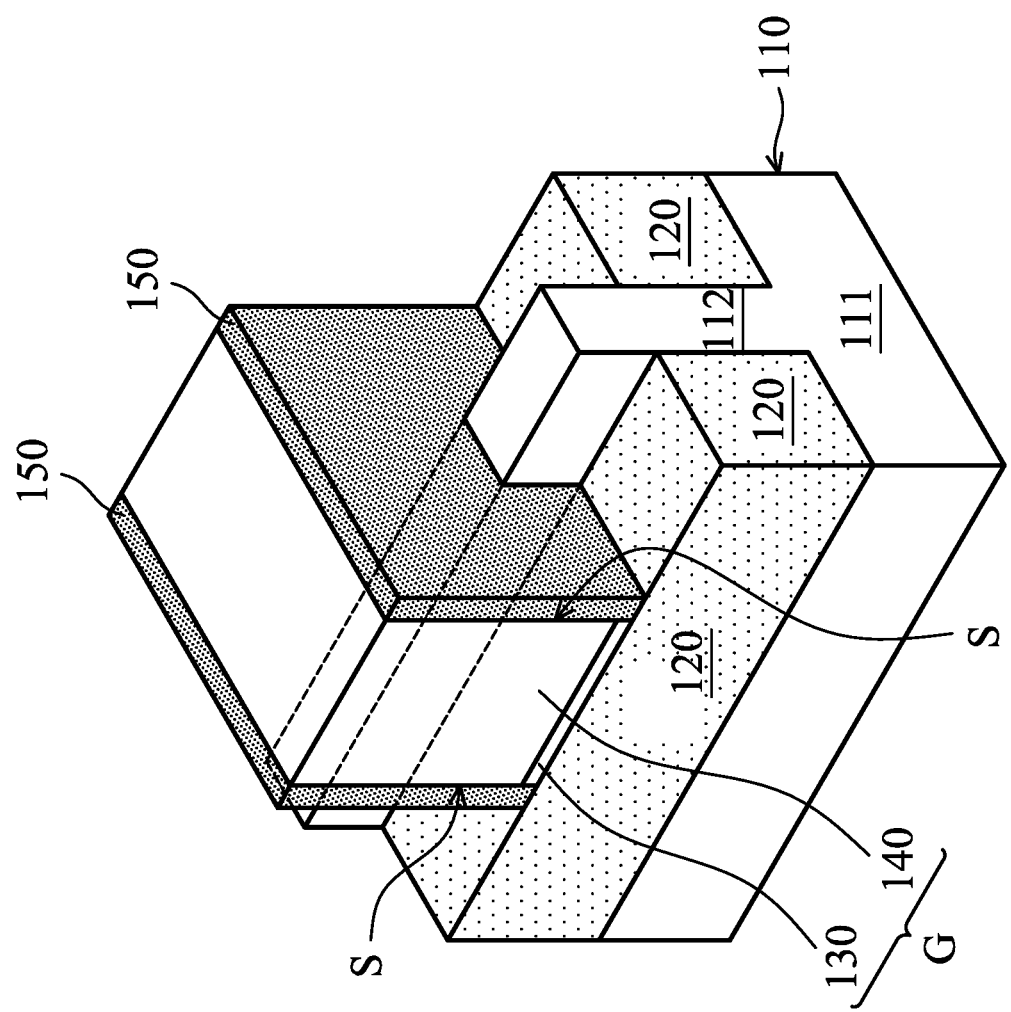

As shown in FIG. 1B, an isolation layer 120 is formed over the base 111, in accordance with some embodiments. The fin structure 112 is partially in the isolation layer 120, in accordance with some embodiments. The isolation layer 120 includes oxide (such as silicon oxide), in accordance with some embodiments. The isolation layer 120 is formed by a chemical vapor deposition (CVD) process and an etching back process, in accordance with some embodiments.

As shown in FIG. 1B, a gate structure G is formed over and across the fin structure 112, in accordance with some embodiments. The gate structure G has a gate dielectric layer 130 and a gate electrode 140, in accordance with some embodiments. The gate electrode 140 is over the gate dielectric layer 130, in accordance with some embodiments.

The gate dielectric layer 130 is positioned between the gate electrode 140 and the fin structure 112, in accordance with some embodiments. The gate dielectric layer 130 is also positioned between the gate electrode 140 and the isolation layer 120, in accordance with some embodiments.

The gate dielectric layer 130 is made of an oxide-containing material such as silicon oxide, in accordance with some embodiments. The gate dielectric layer 130 is formed using a chemical vapor deposition process (CVD process) and an etching process, in accordance with some embodiments. The gate electrode 140 is made of a semiconductor material such as polysilicon, in accordance with some embodiments. The gate electrode 140 is formed using a chemical vapor deposition process and an etching process, in accordance with some embodiments.

As shown in FIG. 1B, a spacer layer 150 is formed over sidewalls S of the gate structure G, in accordance with some embodiments. The spacer layer 150 surrounds the gate structure G, in accordance with some embodiments. The spacer layer 150 is positioned over the fin structure 112 and the isolation layer 120, in accordance with some embodiments.

The spacer layer 150 includes insulating materials, such as silicon oxide, silicon nitride, silicon oxynitride, or silicon carbide, in accordance with some embodiments. The formation of the spacer layer 150 includes a deposition process and an anisotropic etching process, in accordance with some embodiments.

Figure 1C:
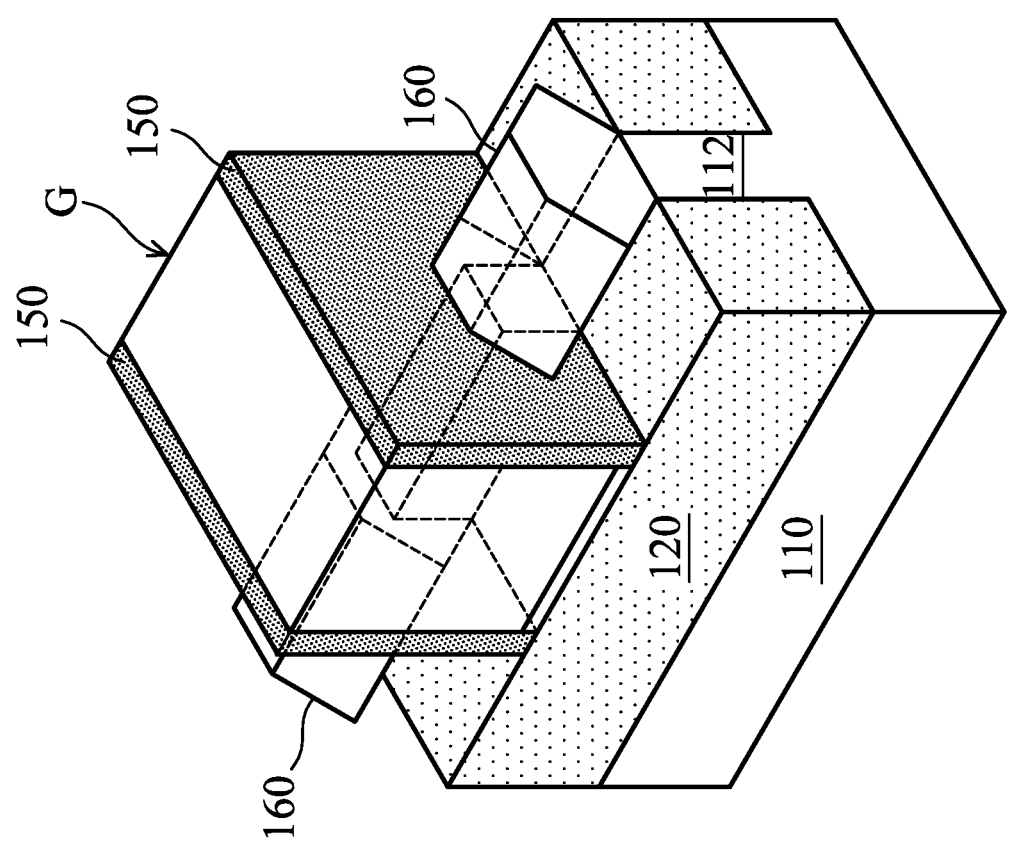

As shown in FIG. 1C, portions of the fin structure 112, which are not covered by the gate structure G and the spacer layer 150, are removed, in accordance with some embodiments. The removal process includes an etching process, in accordance with some embodiments.

As shown in FIG. 1C, stressors 160 are formed over the fin structure 112, in accordance with some embodiments. The stressors 160 are in direct contact with the fin structure 112, in accordance with some embodiments. The stressors 160 are positioned on two opposite sides of the gate structure G, in accordance with some embodiments. In some embodiments, the stressors 160 include a source structure and a drain structure.

In some embodiments, the stressors 160 are made of a semiconductor material (e.g., silicon) with N-type dopants, such as the Group VA element, in accordance with some embodiments. The Group VA element includes phosphor (P), antimony (Sb), or another suitable Group VA material.

In some other embodiments, the stressors 160 are made of a semiconductor material (e.g., silicon germanium) with P-type dopants, such as the Group IIIA element, in accordance with some embodiments. The Group IIIA element includes boron or another suitable material. The stressors 160 are formed using an epitaxial process, in accordance with some embodiments.

Figure 1D:
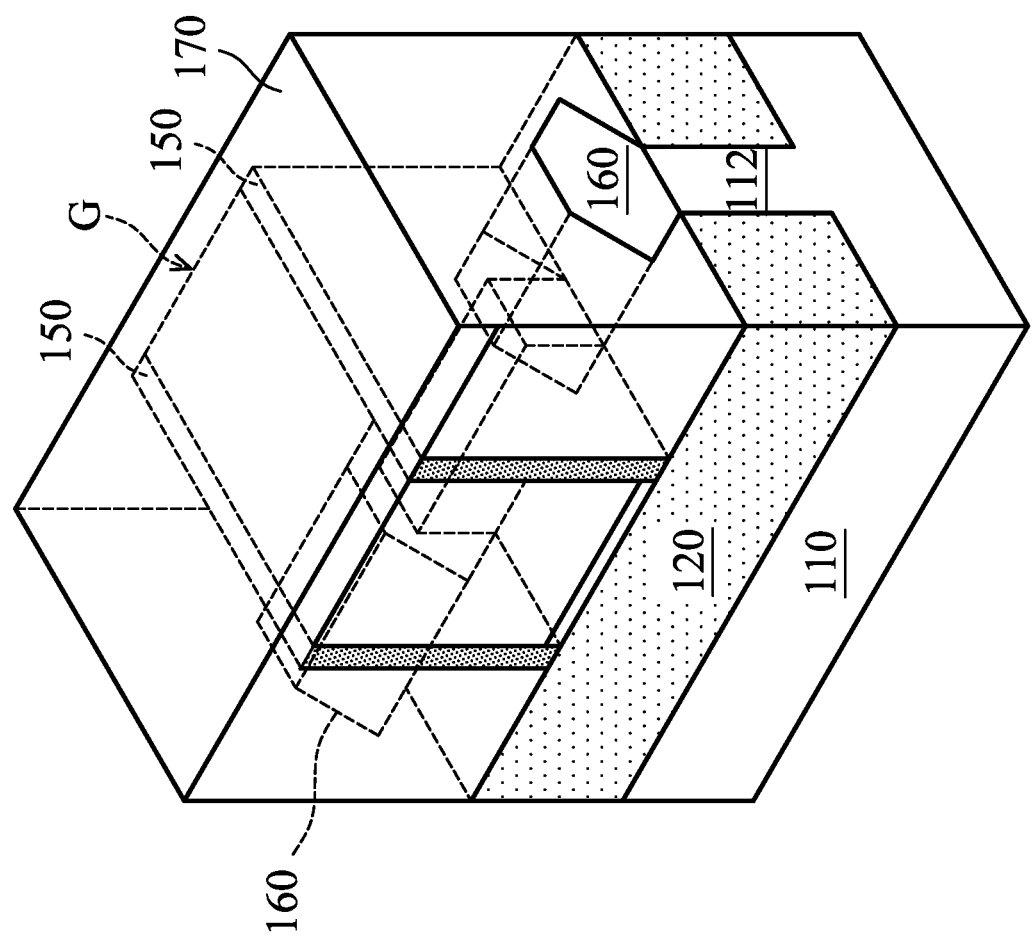

As shown in FIG. 1D, an insulating layer 170 is formed over the gate structure G, the spacer layer 150, the isolation layer 120, and the stressors 160, in accordance with some embodiments. The insulating layer 170 includes an oxide-containing material such as silicon oxide, in accordance with some embodiments. The insulating layer 170 is formed by a deposition process such as a chemical vapor deposition (CVD) process, in accordance with some embodiments.

Figure 1E:
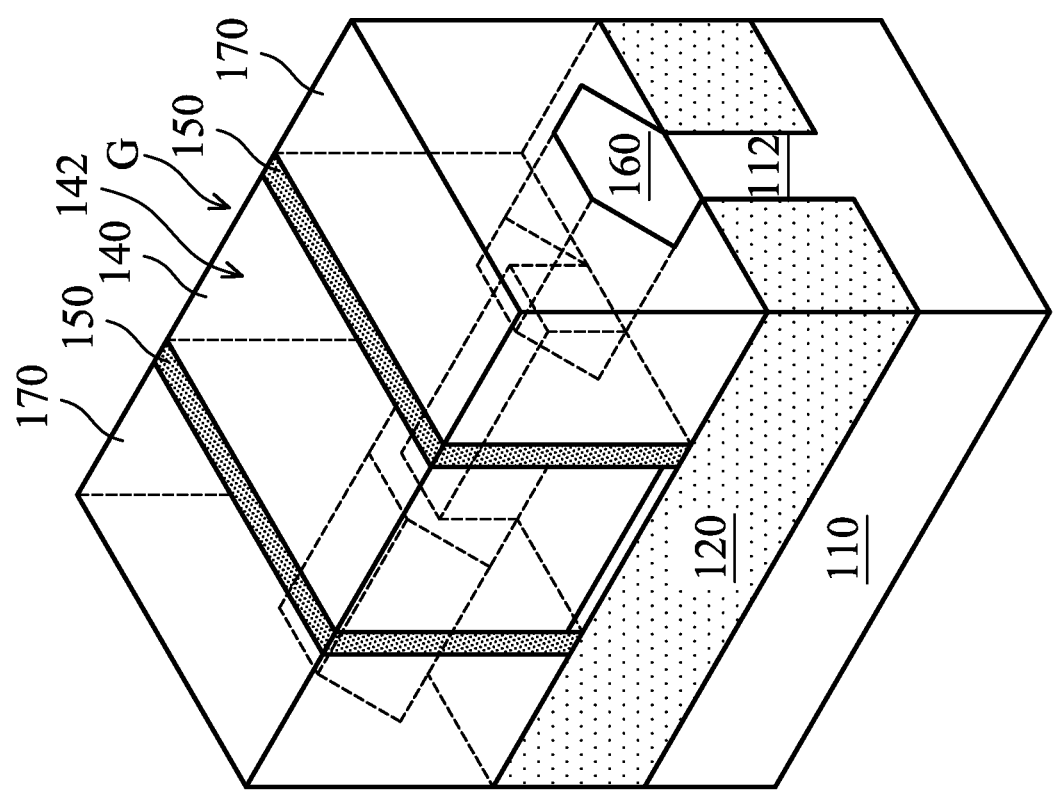

As shown in FIG. 1E, a planarization process is then performed on the insulating layer 170 until a top surface 142 of the gate electrode 140 is exposed, in accordance with some embodiments. The planarization process includes a chemical mechanical polishing (CMP) process, in accordance with some embodiments.

Figure 1F:
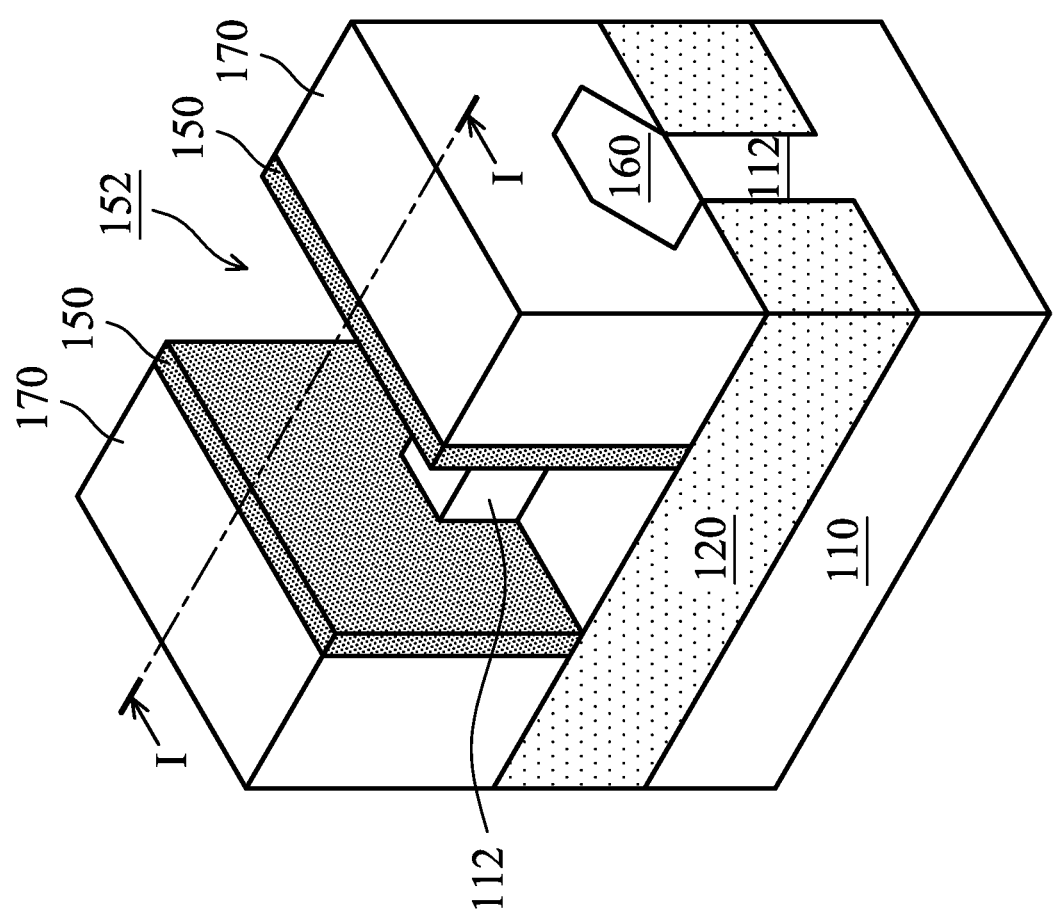
Figure 2A:
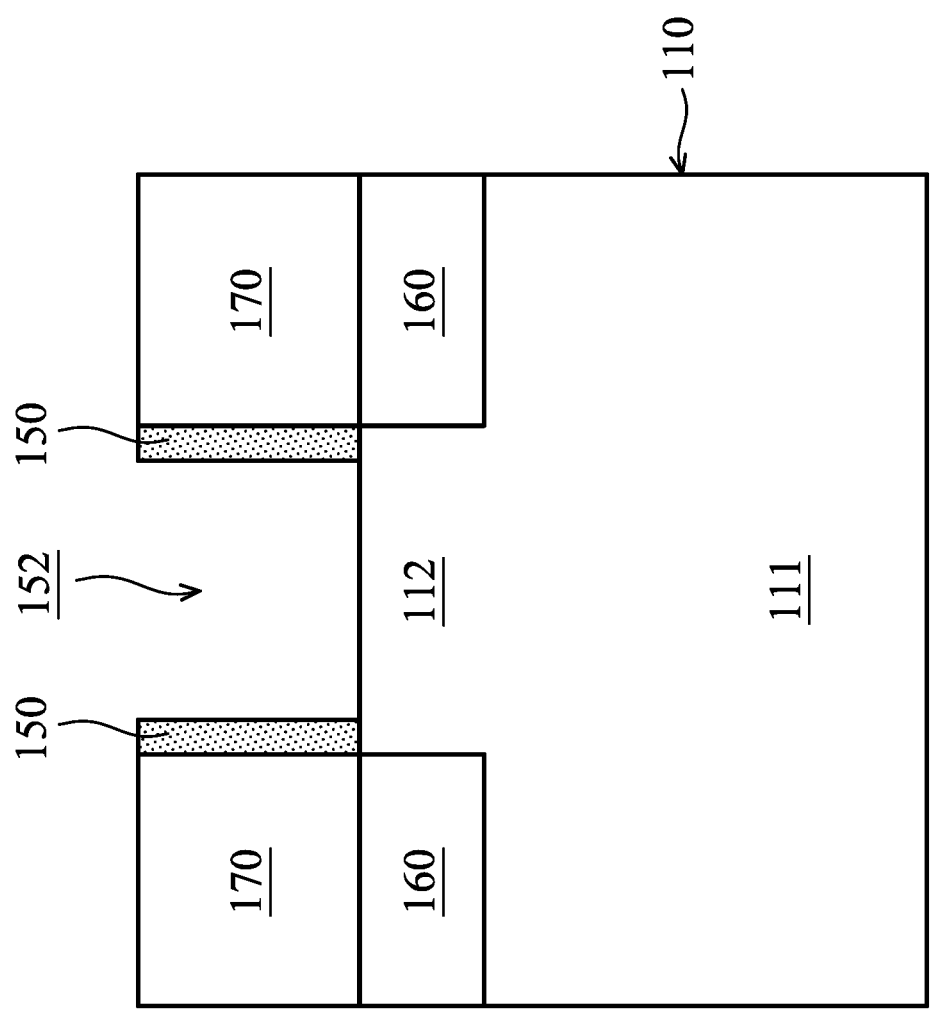
FIGS. 2A-2H are cross-sectional views of various stages of a process for forming a semiconductor device structure, in accordance with some embodiments.

FIG. 2A is a cross-sectional view illustrating the semiconductor device structure along a sectional line I-I in FIG. 1F, in accordance with some embodiments. As shown in FIGS. 1F and 2A, the gate structure G is removed, in accordance with some embodiments. The removal process includes a wet etching process, in accordance with some embodiments. After the removal process, a trench 152 is formed in the spacer layer 150, in accordance with some embodiments. The trench 152 exposes a portion of the fin structure 112, in accordance with some embodiments.

Figure 2B:
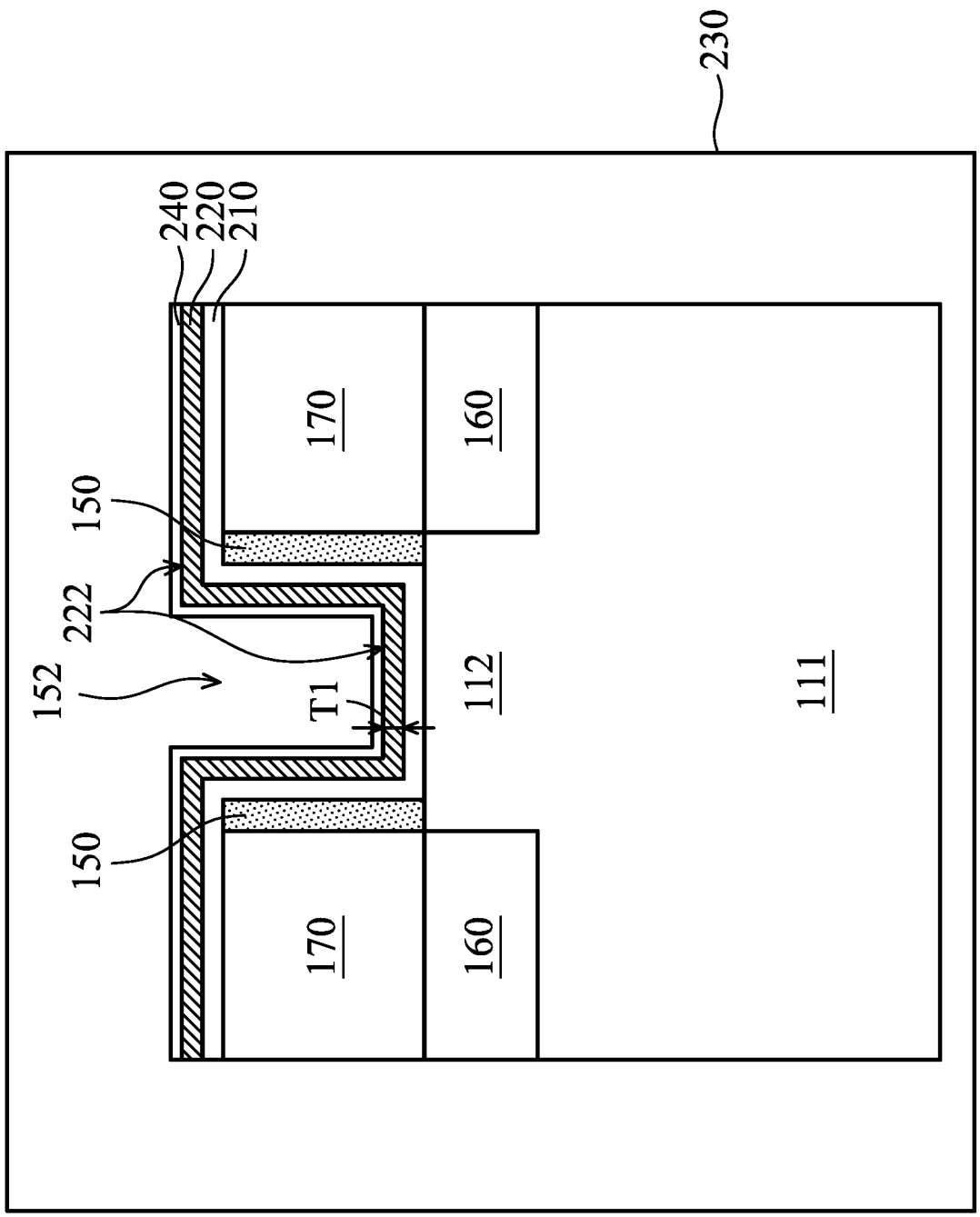

FIGS. 2A-2H are cross-sectional views of various stages of a process for forming a semiconductor device structure, in accordance with some embodiments. After the step of FIG. 2A, as shown in FIG. 2B, a gate dielectric layer 210 is formed in the trench 152 and over the fin structure 112 exposed by the trench 152, in accordance with some embodiments. The gate dielectric layer 210 conformally covers the spacer layer 150, the insulating layer 170, and the fin structure 112, in accordance with some embodiments.

In some embodiments, a dielectric constant of the gate dielectric layer 210 is greater than a dielectric constant of silicon dioxide. The gate dielectric layer 210 is also referred to as a high dielectric-constant (high-k) layer, in accordance with some embodiments.

The gate dielectric layer 210 is made of a high-k dielectric material, such as hafnium dioxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

The formation of the gate dielectric layer 210 includes conformally depositing the gate dielectric layer 210 over the spacer layer 150, the insulating layer 170, and the fin structure 112, in accordance with some embodiments. The deposition process includes a chemical vapor deposition process, an atomic layer deposition (ALD) process, or a physical vapor deposition process, in accordance with some embodiments.

In some other embodiments (not shown), an interfacial layer is formed over the fin structure 112 before the formation of the gate dielectric layer 210 to improve the adhesion between the gate dielectric layer 210 and the fin structure 112. The interfacial layer is made of an oxide-containing material such as silicon oxide, in accordance with some embodiments.

Thereafter, as shown in FIG. 2B, a work function metal layer 220 is formed over the gate dielectric layer 210, in accordance with some embodiments. The work function metal layer 220 is also referred to as a metal-containing layer, in accordance with some embodiments. The work function metal layer 220 provides a desired work function for a transistor to enhance device performance including improved threshold voltage.

In the embodiments of forming a PMOS transistor, the work function metal layer 220 is used to provide a work function value suitable for the device, such as equal to or greater than about 4.8 eV. The work function metal layer 220 may be made of metal, metal carbide, metal nitride, other suitable materials, or a combination thereof. For example, the work function metal layer 220 is made of titanium, titanium nitride, other suitable materials, or a combination thereof.

In the embodiments of forming an NMOS transistor, the work function metal layer 220 is used to provide a work function value suitable for the device, such as equal to or less than about 4.5 eV. The work function metal layer 220 may be made of metal, metal carbide, metal nitride, or a combination thereof. For example, the work function metal layer 220 is made of tantalum, tantalum nitride, or a combination thereof.

The work function metal layer 220 is formed using a deposition process, in accordance with some embodiments. The deposition process includes an atomic layer deposition (ALD), a chemical vapor deposition (CVD) process, another suitable method, or a combination thereof. The deposition process is performed in a chamber 230, in accordance with some embodiments. The chamber 230 includes an atomic layer deposition chamber or a chemical vapor deposition chamber, in accordance with some embodiments.

Afterwards, as shown in FIG. 2B, a silicon-containing layer 240 is formed over the work function metal layer 220, in accordance with some embodiments. The silicon-containing layer 240 is conformally deposited over the work function metal layer 220, in accordance with some embodiments. The silicon-containing layer 240 continuously covers an entire top surface 222 of the work function metal layer 220, in accordance with some embodiments.

The silicon-containing layer 240 is thinner than the work function metal layer 220, in accordance with some embodiments. The work function metal layer 220 has a thickness T1 ranging from about 20 Å to about 50 Å, in accordance with some embodiments.

The silicon-containing layer 240 is made of silicon oxide such as silicon dioxide, in accordance with some embodiments. The formation of the silicon-containing layer 240 includes forming a silicon layer over the work function metal layer 220; and oxidizing the silicon layer, in accordance with some embodiments. The silicon layer is formed using a soaking process, in accordance with some embodiments.

During the soaking process, the work function metal layer 220 is soaked in a silicon-containing compound (e.g., a silicon-containing gas), in accordance with some embodiments. In some embodiments, the soaking process is performed by providing the silicon-containing compound in the chamber 230 and on the work function metal layer 220. The silicon-containing layer 240 and the work function metal layer 220 are formed in the same chamber 230, in accordance with some embodiments.

The flow rate of the silicon-containing compound during the soaking process ranges from about 10 sccm to about 1000 sccm, in accordance with some embodiments. The process temperature of the soaking process ranges from about 200° C. to about 500° C., in accordance with some embodiments. The process time of the soaking process ranges from about 10 seconds to about 1000 seconds, in accordance with some embodiments.

The silicon layer is oxidized by oxygen in the chamber 230 and/or environmental oxygen, in accordance with some embodiments. The silicon-containing compound is represented by formula $Si_nH_{2n+2}$, and n is an integer from 1 to 10, in accordance with some embodiments. That is, the silicon-containing compound is $SiH_4$, $Si_2H_6$, $Si_3H_8$, or the like, in accordance with some embodiments.

Since the silicon-containing layer 240 and the work function metal layer 220 are formed in the same chamber 230, the silicon-containing layer 240 is able to protect the work function metal layer 220 thereunder from environmental oxygen (i.e., oxygen outside of the chamber 230). Therefore, the work function metal layer 220 is prevented from oxidation, and the electrical resistance of the work function metal layer 220 is prevented from being increased. As a result, the performance of a transistor with the work function metal layer 220 and the silicon-containing layer 240 is improved, in accordance with some embodiments.

Figure 2C:
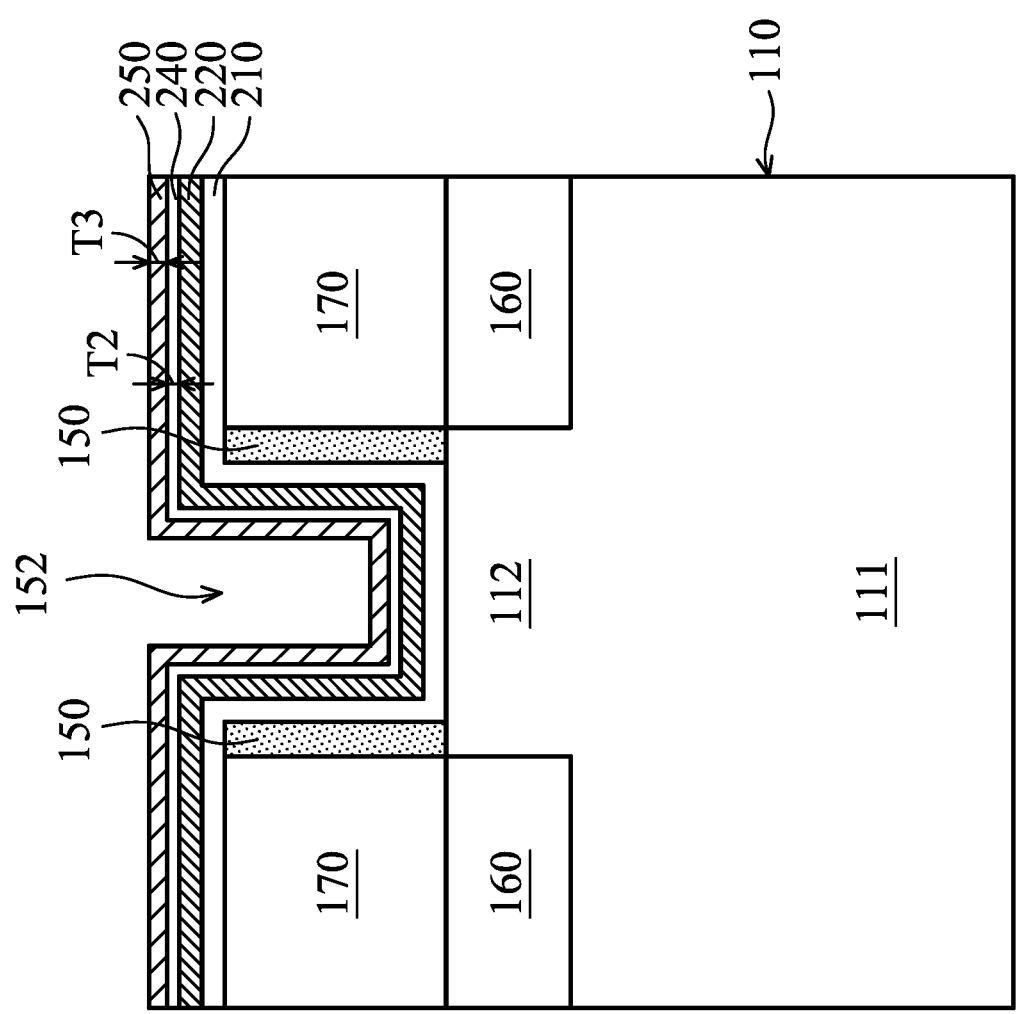

As shown in FIG. 2C, a work function metal layer 250 is deposited over the silicon-containing layer 240, in accordance with some embodiments. In the embodiments of forming a PMOS transistor, the work function metal layer 250 is used to provide a work function value suitable for the device, such as equal to or greater than about 4.8 eV. The work function metal layer 250 may be made of metal, metal carbide, metal nitride, other suitable materials, or a combination thereof. For example, the work function metal layer 250 is made of titanium, titanium nitride ($Ti_3N_4$), other suitable materials, or a combination thereof.

In the embodiments of forming an NMOS transistor, the work function metal layer 250 is used to provide a work function value suitable for the device, such as equal to or less than about 4.5 eV. The work function metal layer 250 may be made of metal, metal carbide, metal nitride, or a combination thereof. For example, the work function metal layer 250 is made of tantalum, tantalum nitride, or a combination thereof.

The work function metal layer 250 is formed using an atomic layer deposition process, in accordance with some embodiments. The atomic layer deposition process uses a metal-containing compound (e.g., $TiCl_4$) as a precursor, in accordance with some embodiments. In some embodiments, a superficial portion of the silicon-containing layer 240 tends to have Si—OH bond, and the metal-containing compound tends to be bonded with Si—OH bond to convert Si—OH bond into Si—O—$TiCl_3$. In some embodiments, the silicon-containing layer 240 has Si—O—Si bond, and the metal-containing compound tends to be bonded with Si—O—Si bond to convert Si—O—Si bond into Si—O—$TiCl_3$. Therefore, the silicon-containing layer 240 tends to bond with the metal-containing compound, in accordance with some embodiments. As a result, an incubation time of the atomic layer deposition process is reduced, in accordance with some embodiments. Therefore, the silicon-containing layer 240 improves the deposition speed and the deposition uniformity of the work function metal layer 250, in accordance with some embodiments. As a result, the silicon-containing layer 240 improves the thickness of the work function metal layer 250 as well, and the electrical resistance of a gate with the work function metal layer 250 is reduced, in accordance with some embodiments.

The silicon-containing layer 240 is thinner than the work function metal layer 250, in accordance with some embodiments. The silicon-containing layer 240 has a thickness T2 ranging from about 3 Å to about 20 Å, in accordance with some embodiments. If the thickness T2 is less than 3 Å, the silicon-containing layer 240 may be unable to significantly improve the deposition speed and the deposition uniformity of the work function metal layer 250. If the thickness T2 is greater than 20 Å, the silicon-containing layer 240 may occupy too much space of the trench 152. The work function metal layer 250 has a thickness T3 ranging from about 20 Å to about 50 Å, in accordance with some embodiments.

Figure 2D:
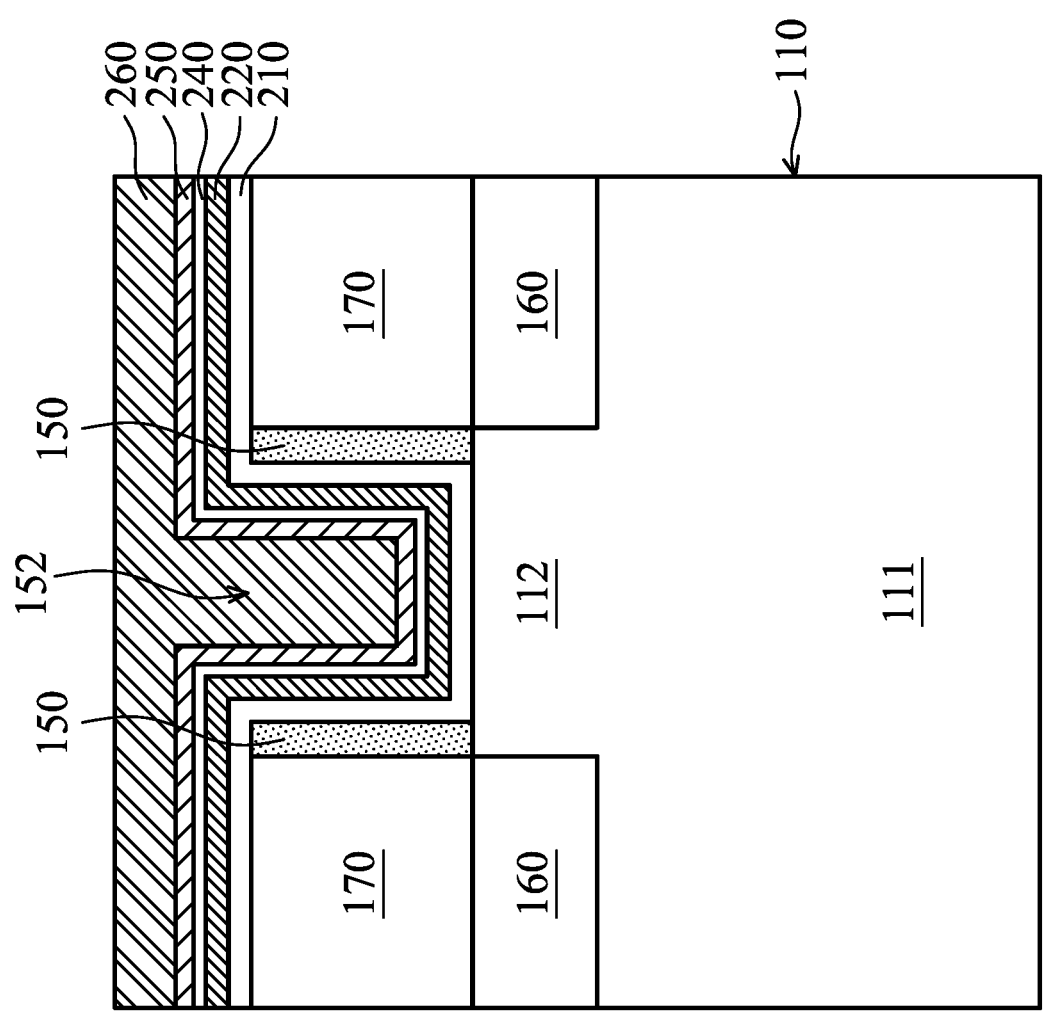

As shown in FIG. 2D, a gate electrode layer 260 is formed in the trench 152 and over the work function metal layer 250, in accordance with some embodiments. The gate electrode layer 260 is made of a suitable conductive material, such as metal (e.g., aluminum, tungsten, gold, platinum, or cobalt), an alloy thereof, or a combination thereof, in accordance with some embodiments. The gate electrode layer 260 is formed using a deposition process such as a physical vapor deposition (PVD) process, a chemical vapor deposition (CVD) process, or an atomic layer deposition (ALD) process, in accordance with some embodiments.

Figure 2E:
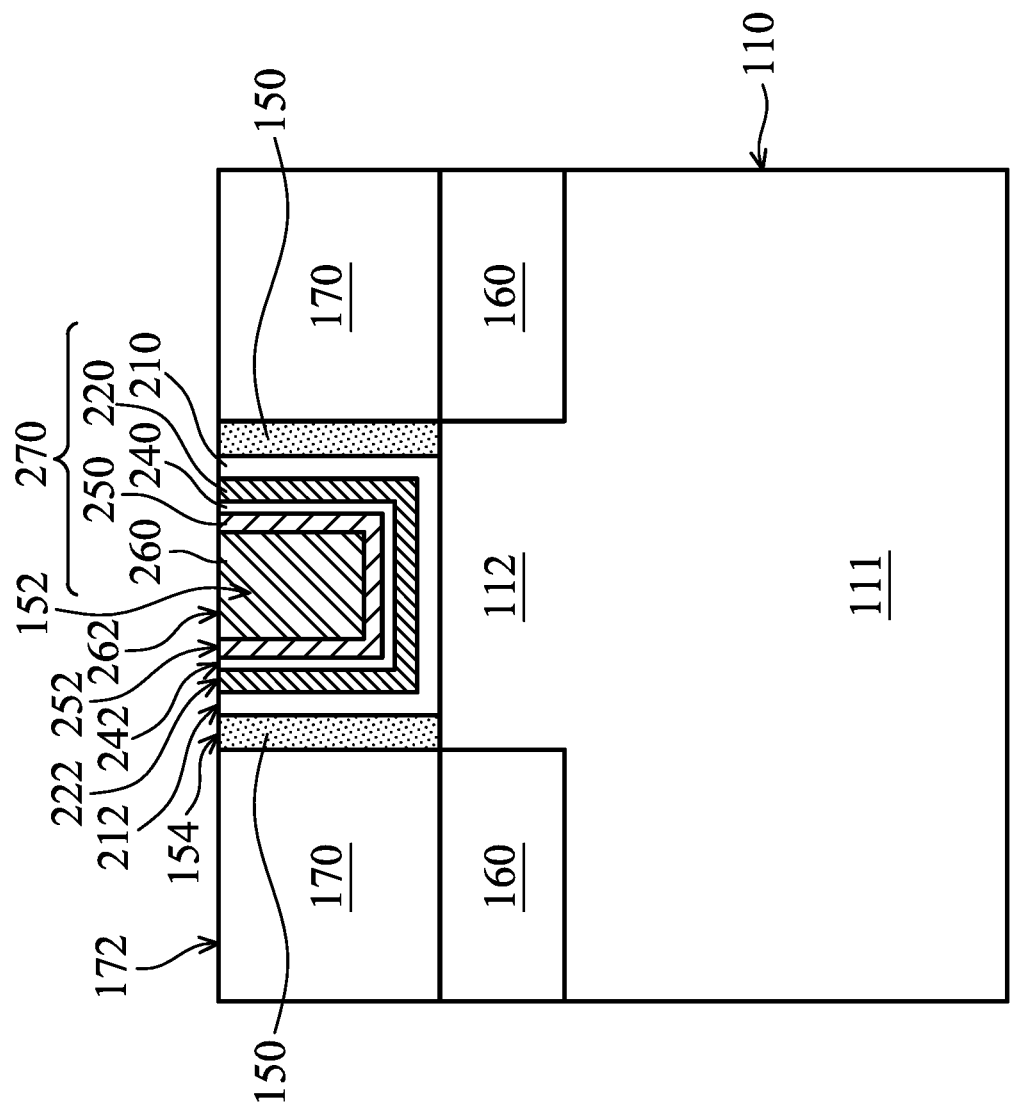
Figure 3:
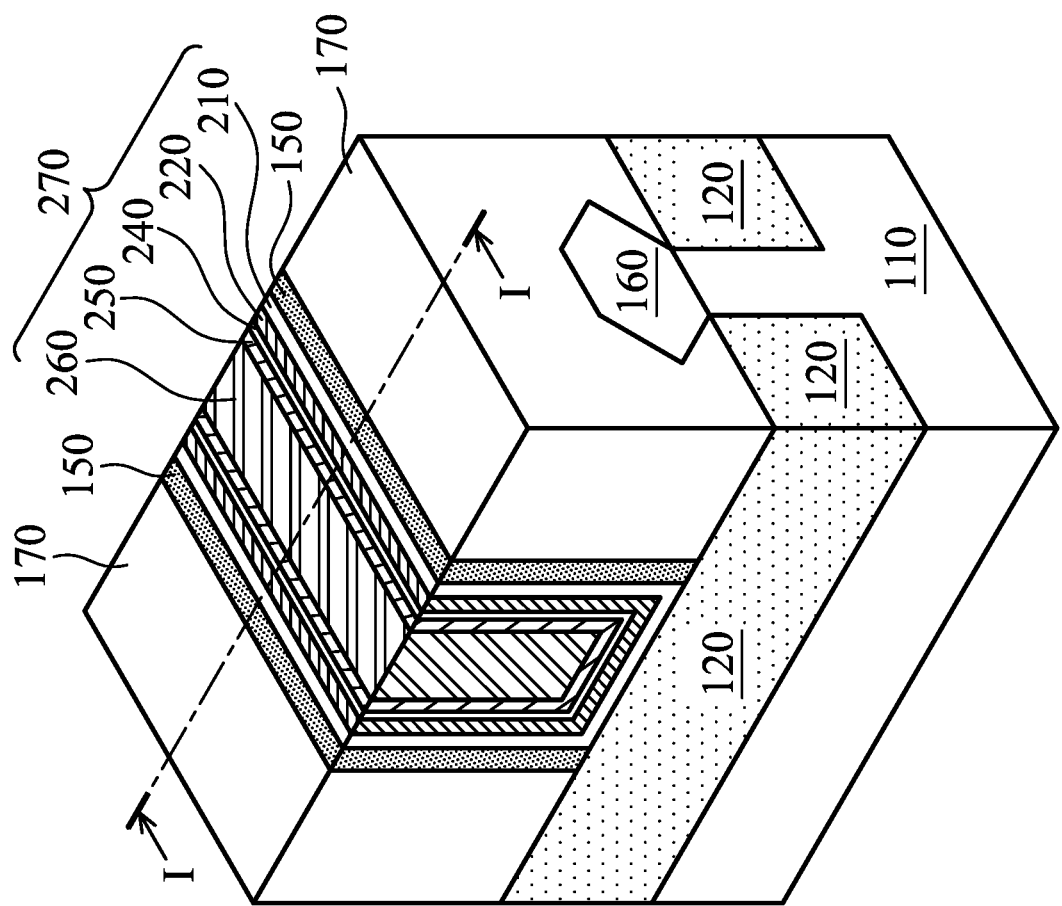
FIG. 3 is a perspective view of the semiconductor device structure of FIG. 2E, in accordance with some embodiments.

FIG. 3 is a perspective view of the semiconductor device structure of FIG. 2E, in accordance with some embodiments. FIG. 2E is a cross-sectional view illustrating the semiconductor device structure along a sectional line I-I in FIG. 3, in accordance with some embodiments.

As shown in FIGS. 2E and 3, the gate dielectric layer 210, the work function metal layer 220, the silicon-containing layer 240, the work function metal layer 250, and the gate electrode layer 260 outside of the trench 152 are removed, in accordance with some embodiments. The top surfaces 212, 222, 242, 252, 262, 154, and 172 of the gate dielectric layer 210, the work function metal layer 220, the silicon-containing layer 240, the work function metal layer 250, the gate electrode layer 260, the spacer layer 150, and the insulating layer 170 are substantially coplanar, in accordance with some embodiments. The term "substantially coplanar" in the application may include small deviations from coplanar geometries. The deviations may be due to manufacturing processes.

The gate dielectric layer 210, the work function metal layer 220, the silicon-containing layer 240, the work function metal layer 250, and the gate electrode layer 260 remaining in the trench 152 together form a gate stack 270, in accordance with some embodiments. The gate stack 270 and the stressors 160 (including a source structure and a drain structure) together form a transistor, in accordance with some embodiments. The removal process includes a planarization process such as a chemical mechanical polishing (CMP) process, in accordance with some embodiments.

Figure 2F:
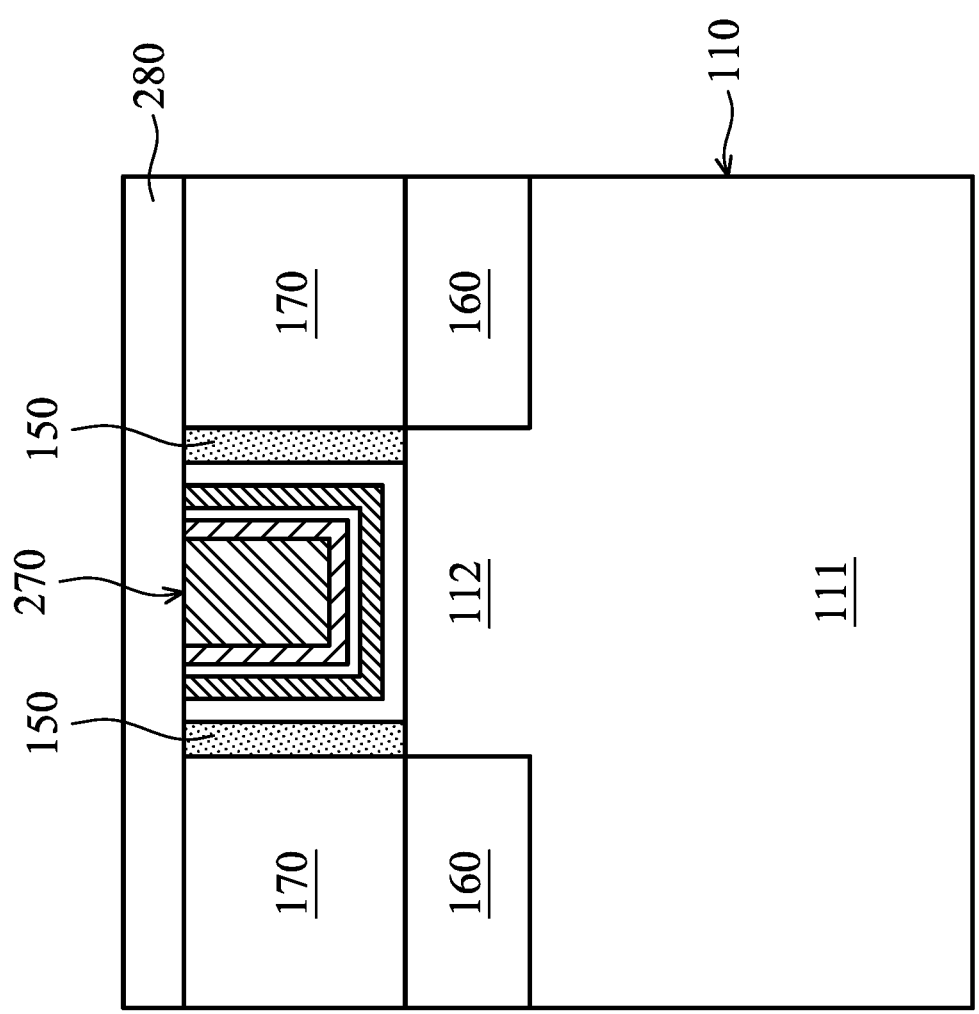

As shown in FIG. 2F, an insulating layer 280 is formed over the gate stack 270, the spacer layer 150, and the insulating layer 170, in accordance with some embodiments. The insulating layer 280 includes an oxide-containing material such as silicon oxide, in accordance with some embodiments. The insulating layer 280 is formed by a deposition process such as a chemical vapor deposition process, in accordance with some embodiments.

Figure 2G:
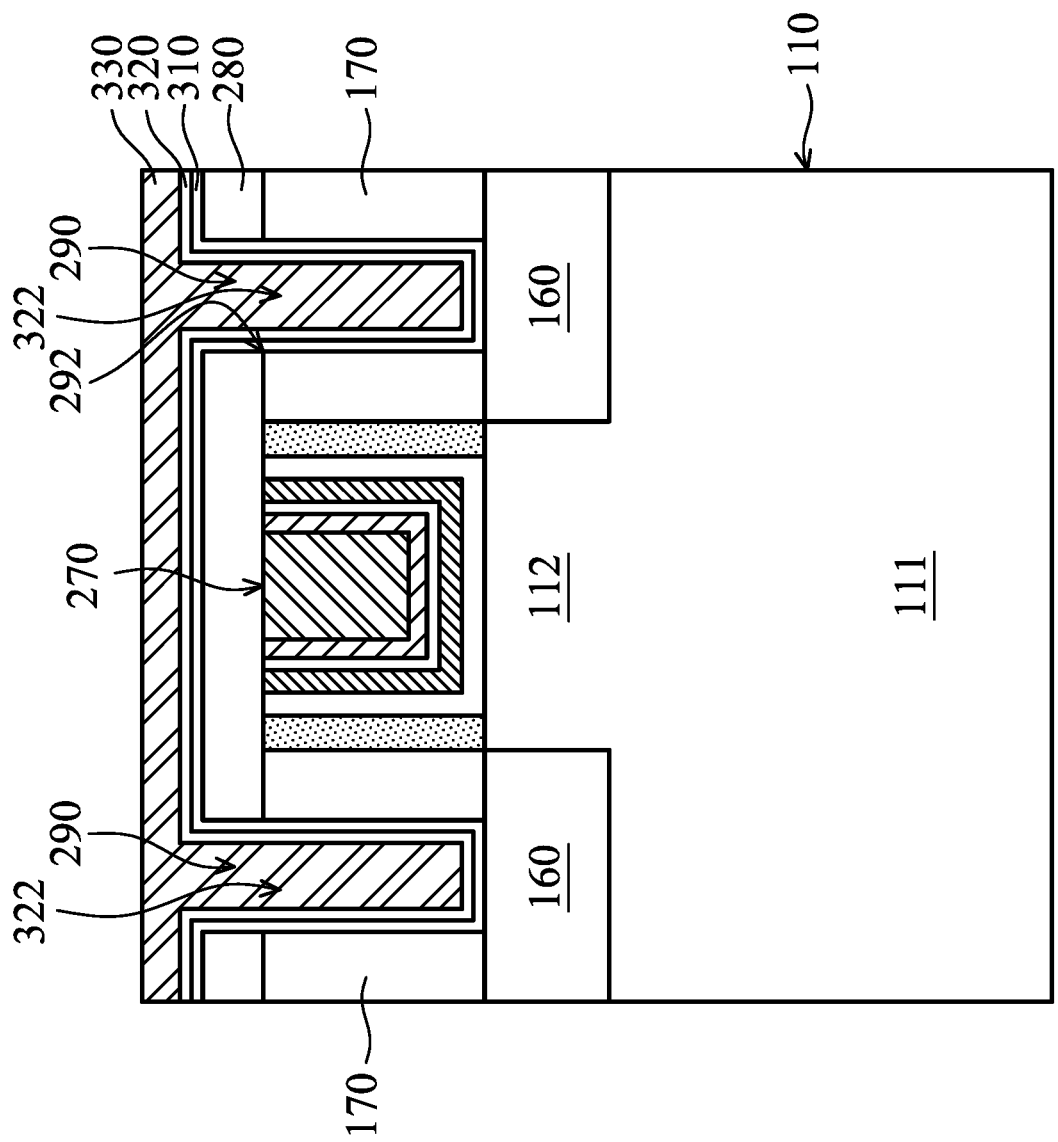

As shown in FIG. 2G, portions of the insulating layers 170 and 280 are removed to form through holes 290 in the insulating layers 170 and 280, in accordance with some embodiments. Each through hole 290 passes through the insulating layers 170 and 280 to expose the stressor 160 thereunder, in accordance with some embodiments. The removal process includes an etching process such as a dry etching process, in accordance with some embodiments.

As shown in FIG. 2G, a silicon-containing layer 310 is deposited over the insulating layer 280 and in the through holes 290, in accordance with some embodiments. The silicon-containing layer 310 conformally covers the stressors 160 and inner walls 292 of the through holes 290, in accordance with some embodiments. The forming methods and materials of the silicon-containing layer 310 are similar to or the same as that of the silicon-containing layer 240, in accordance with some embodiments.

As shown in FIG. 2G, a barrier layer 320 is deposited in the through holes 290 and over the silicon-containing layer 310, in accordance with some embodiments. The barrier layer 320 conformally covers the silicon-containing layer 310, in accordance with some embodiments. The barrier layer 320 has recesses 322 in the through holes 290, in accordance with some embodiments. The barrier layer 320 is configured to prevent metal elements of a conductive layer subsequently formed over the barrier layer 320 from diffusing into the insulating layers 170 and 280, in accordance with some embodiments.

The barrier layer 320 is made of a metal nitride material such as titanium nitride, tantalum nitride, or tungsten nitride, in accordance with some embodiments. The barrier layer 320 is formed using an atomic layer deposition process, in accordance with some embodiments. The atomic layer deposition process uses a metal-containing compound (e.g., $TiCl_4$) as a precursor, in accordance with some embodiments. In some embodiments, a superficial portion of the silicon-containing layer 310 tends to have Si—OH bond, and the metal-containing compound tends to be bonded with Si—OH bond to convert Si—OH bond into Si—O—$TiCl_3$. In some embodiments, the silicon-containing layer 310 has Si—O—Si bond, and the metal-containing compound tends to be bonded with Si—O—Si bond to convert Si—O—Si bond into Si—O—$TiCl_3$. Therefore, the silicon-containing layer 310 tends to bond with the metal-containing compound, in accordance with some embodiments. As a result, an incubation time of the atomic layer deposition process is reduced, in accordance with some embodiments. Therefore, the silicon-containing layer 310 improves the deposition speed and the deposition uniformity of the barrier layer 320, in accordance with some embodiments.

As shown in FIG. 2G, a conductive layer 330 is formed over the barrier layer 320 and is filled in the recesses 322, in accordance with some embodiments. The conductive layer 330 is made of a metal material (e.g., tungsten, aluminum, gold, silver, or a combination thereof), an alloy thereof, or another suitable conductive material. The conductive layer 330 is formed using a physical vapor deposition process, a chemical vapor deposition process, or another suitable process.

Figure 2H:
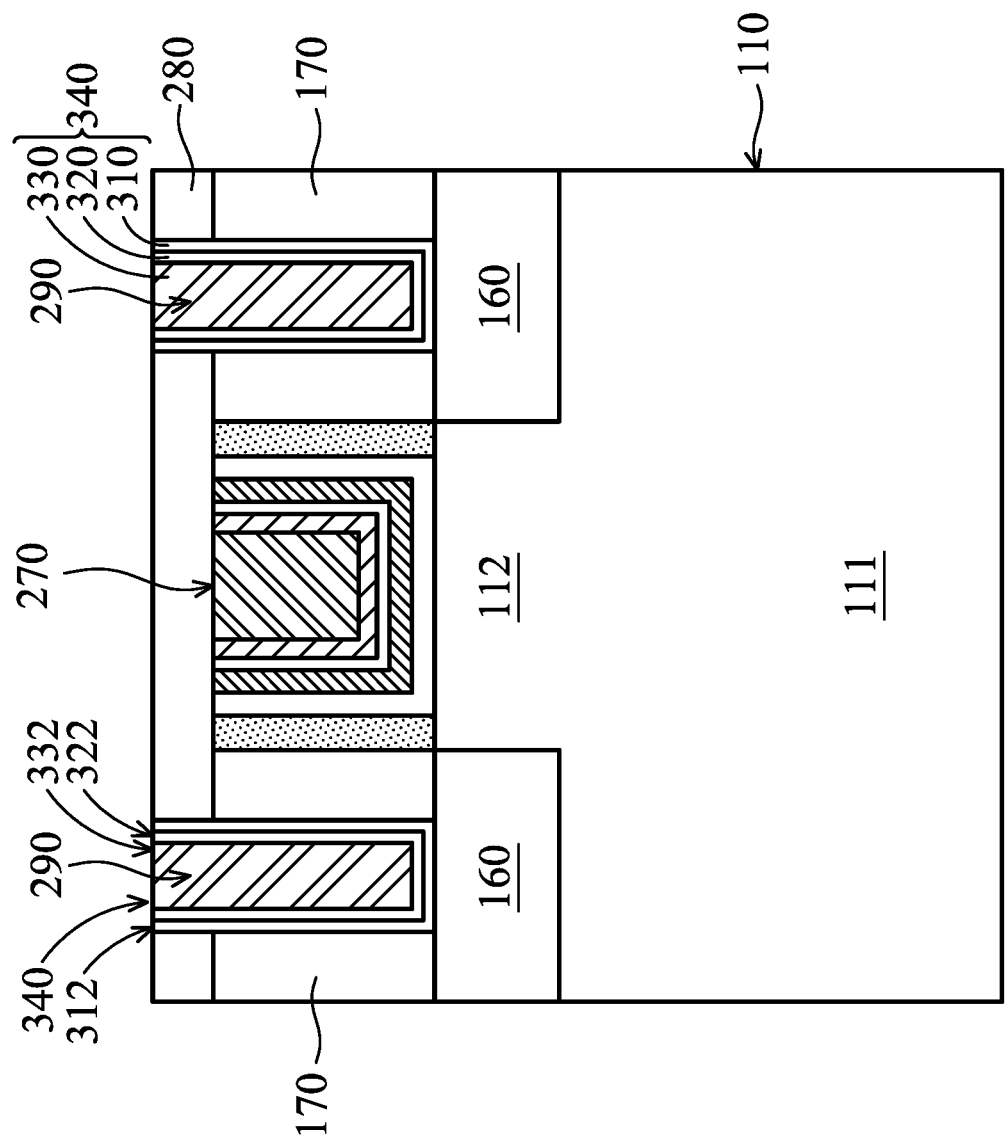
Figure 4:
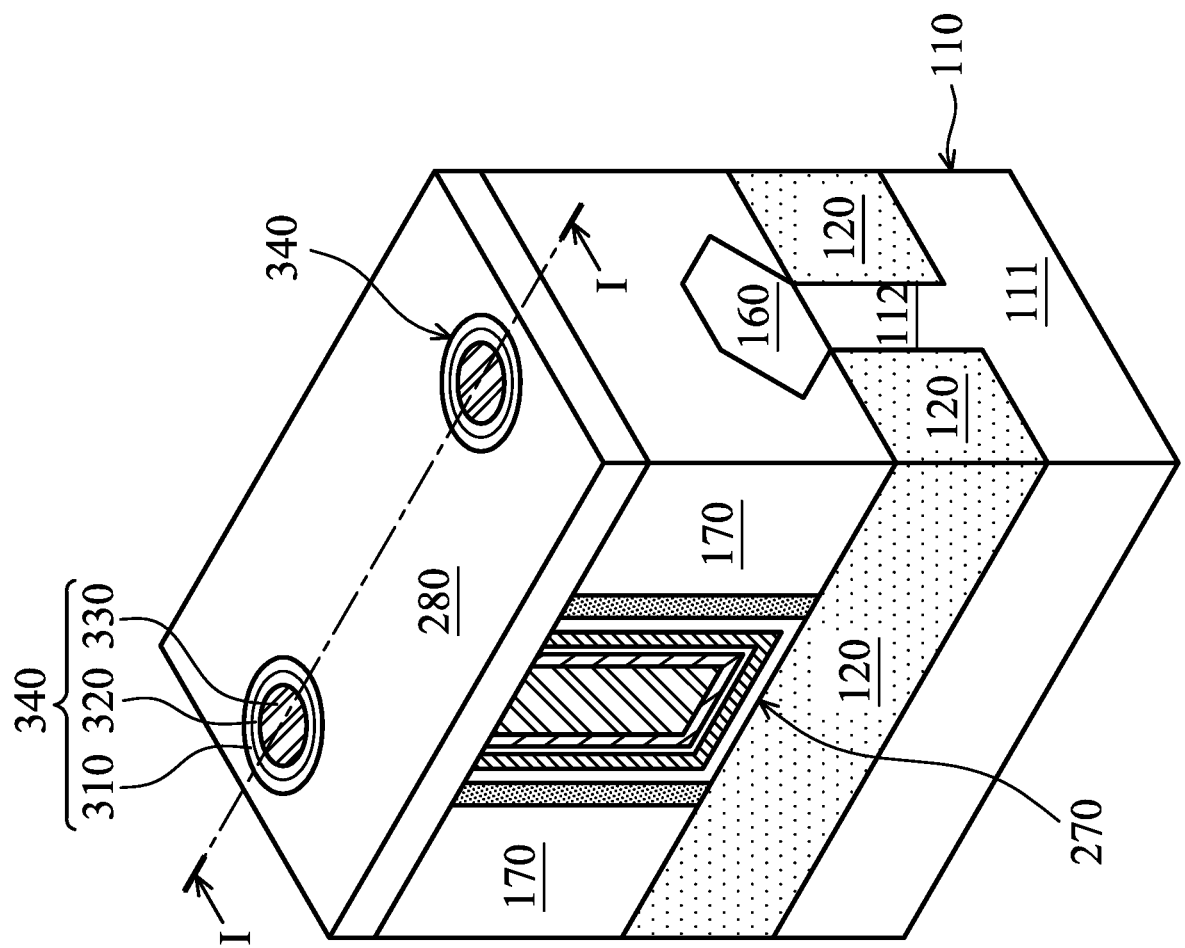
FIG. 4 is a perspective view of the semiconductor device structure of FIG. 2H, in accordance with some embodiments.

FIG. 4 is a perspective view of the semiconductor device structure of FIG. 2H, in accordance with some embodiments. FIG. 2H is a cross-sectional view illustrating the semiconductor device structure along a sectional line I-I in FIG. 4, in accordance with some embodiments.

As shown in FIGS. 2H and 4, the silicon-containing layer 310, the barrier layer 320, and the conductive layer 330 outside of the through holes 290 are removed, in accordance with some embodiments. The silicon-containing layer 310, the barrier layer 320, and the conductive layer 330 remaining in the same through hole 290 together form a contact structure 340, in accordance with some embodiments.

In the contact structure 340, the silicon-containing layer 310 surrounds the conductive layer 330 and the barrier layer 320 thereover, in accordance with some embodiments. Each contact structure 340 passes through the insulating layers 170 and 280 to connect to the stressor 160 thereunder, in accordance with some embodiments.

The barrier layer 320 is between the silicon-containing layer 310 and the conductive layer 330, in accordance with some embodiments. The silicon-containing layer 310 is between the barrier layer 320 and the insulating layers 170 and 280 and between the barrier layer 320 and the stressor 160, in accordance with some embodiments. The removal process includes a planarization process such as a chemical mechanical polishing (CMP) process, in accordance with some embodiments. The top surfaces 312, 322, and 332 of the silicon-containing layer 310, the barrier layer 320, and the conductive layer 330 are substantially coplanar, in accordance with some embodiments.

In some embodiments, the silicon-containing layer 240 is used in a fin field effect transistor (Fin FET). In some other embodiments (as shown in FIGS. 5A-7), the silicon-containing layer 240 is used in a gate all around (GAA) nanowire device.

Figure 5A:
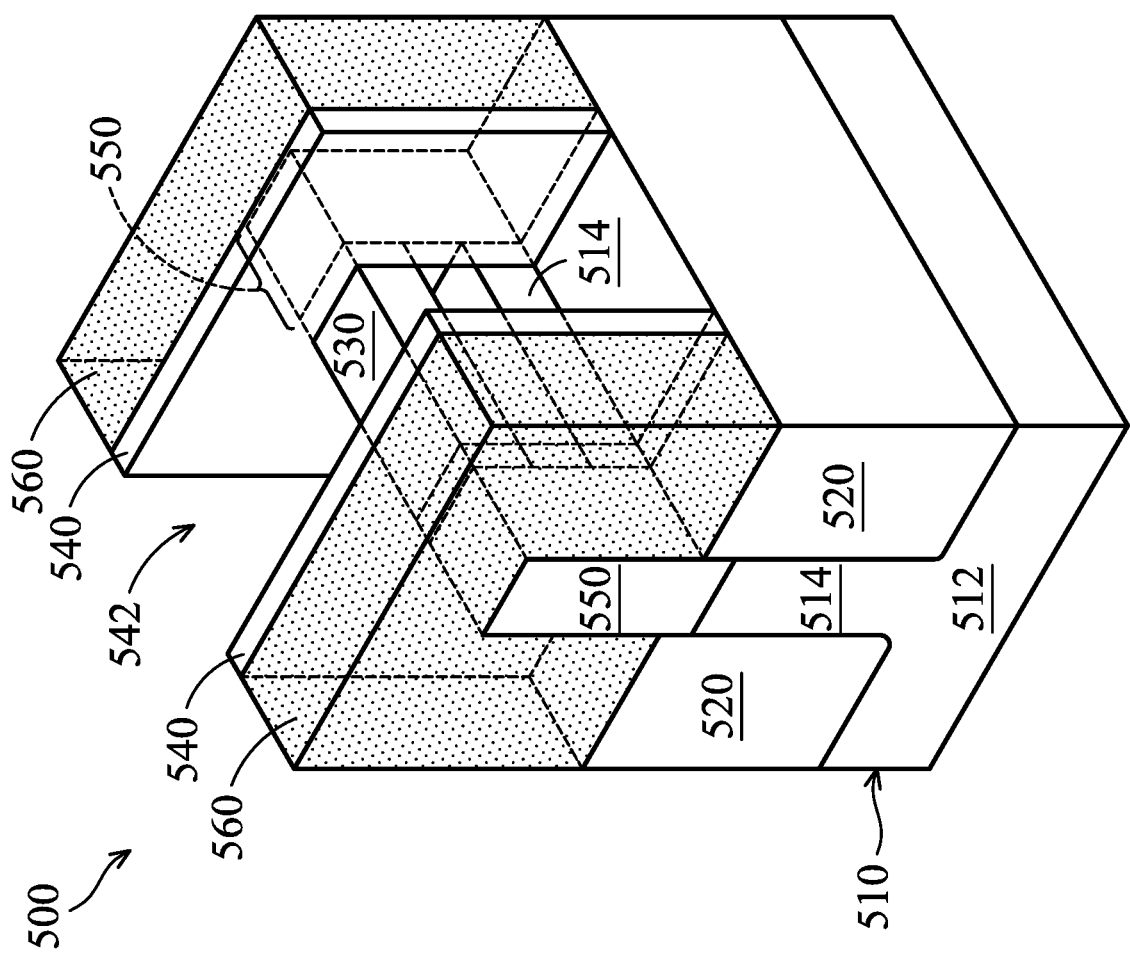
FIG. 5A is a perspective view of a semiconductor device structure, in accordance with some embodiments.
Figure 5B:
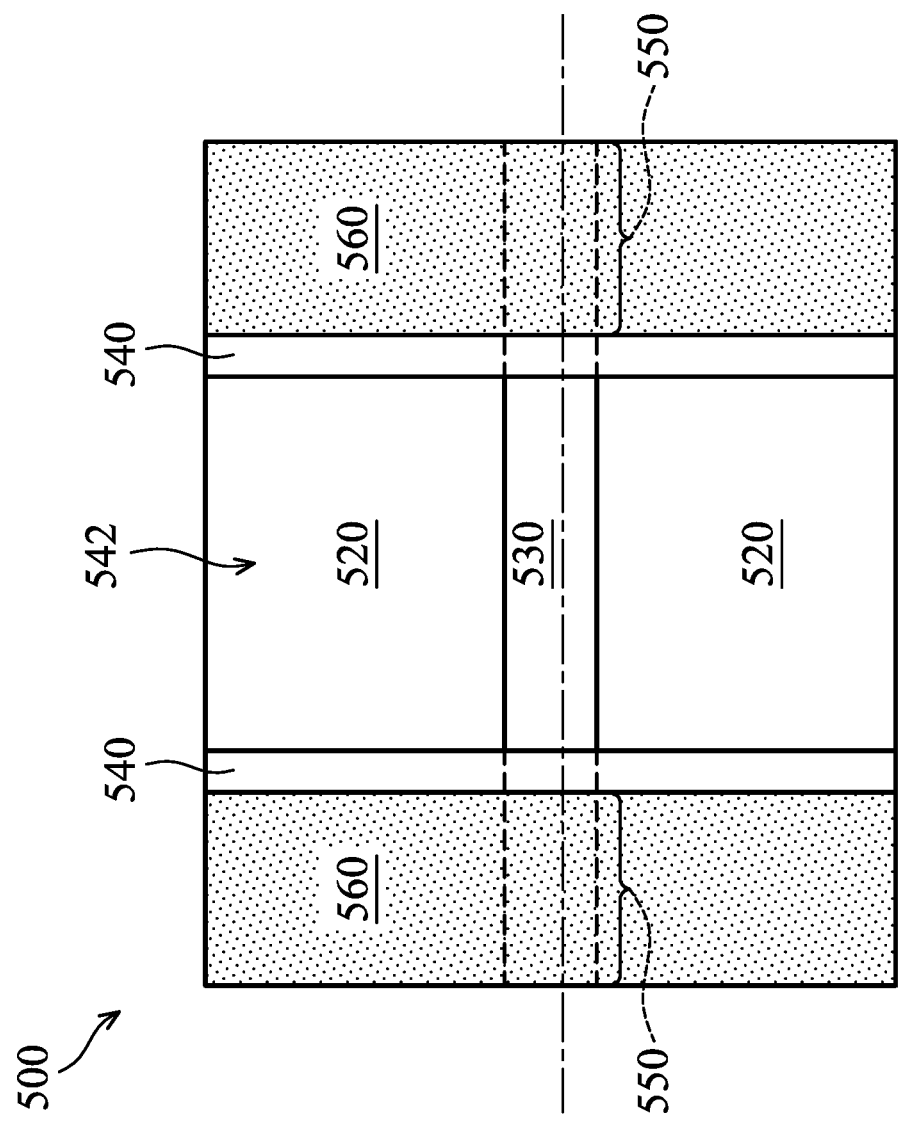
FIG. 5B is a top view of the semiconductor device structure of FIG. 5A, in accordance with some embodiments.
Figure 6A:
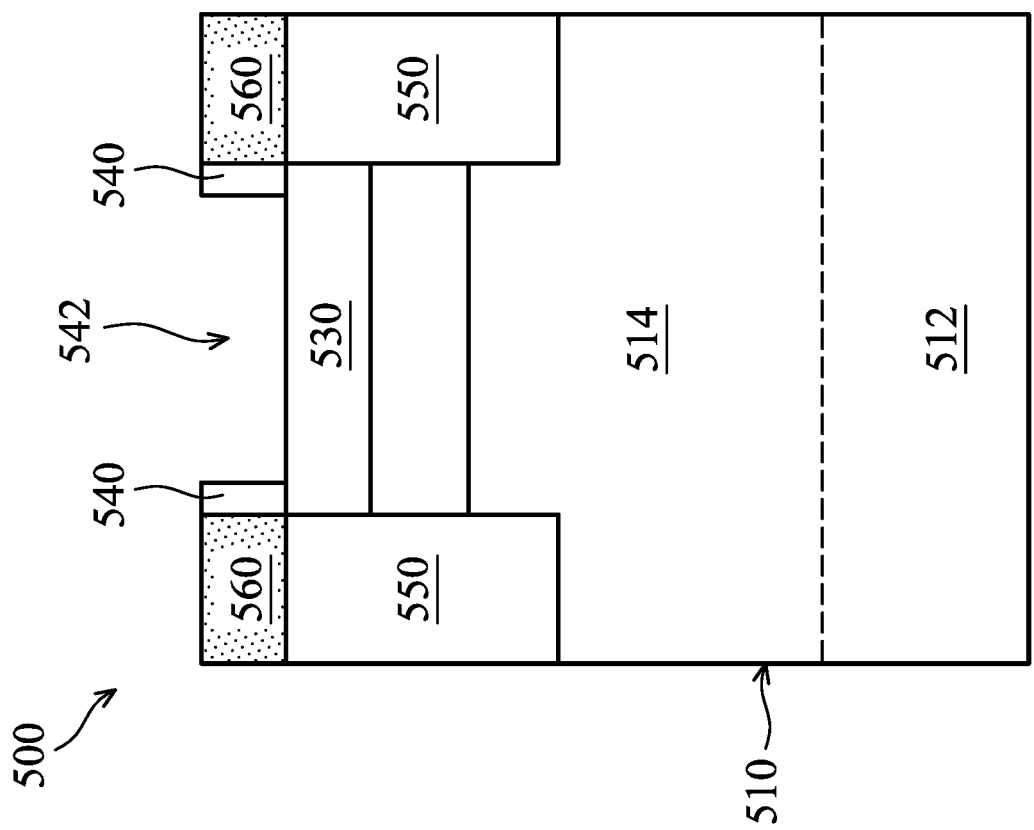
FIGS. 6A-6C are cross-sectional views of various stages of a process for forming a semiconductor device structure, in accordance with some embodiments.

FIG. 5A is a perspective view of a semiconductor device structure 500, in accordance with some embodiments. FIG. 5B is a top view of the semiconductor device structure 500 of FIG. 5A, in accordance with some embodiments. FIG. 6A is a cross-sectional view illustrating the semiconductor device structure 500 along a sectional line I-I in FIG. 5B, in accordance with some embodiments.

As shown in FIGS. 5A, 5B, and 6A, a semiconductor device structure 500 is provided, in accordance with some embodiments. The semiconductor device structure 500 includes a substrate 510, an isolation layer 520, a semiconductor wire 530, a spacer layer 540, stressors 550, and an insulating layer 560, in accordance with some embodiments. The substrate 510 includes a base 512 and a fin structure 514, in accordance with some embodiments. The fin structure 514 is over the base 512, in accordance with some embodiments.

The substrate 510 includes, for example, a semiconductor substrate. The semiconductor substrate includes, for example, a semiconductor wafer (such as a silicon wafer) or a portion of a semiconductor wafer. In some embodiments, the substrate 510 is made of an elementary semiconductor material including silicon or germanium in a single crystal, polycrystal, or amorphous structure.

In some other embodiments, the substrate 510 is made of a compound semiconductor, such as silicon carbide, gallium arsenide, gallium phosphide, indium phosphide, indium arsenide, an alloy semiconductor, such as SiGe, or GaAsP, or a combination thereof. The substrate 510 may also include multi-layer semiconductors, semiconductor on insulator (SOI) (such as silicon on insulator or germanium on insulator), or a combination thereof.

The isolation layer 520 is formed over the base 512 and surrounds the fin structure 514, in accordance with some embodiments. A lower portion of the fin structure 514 is embedded in the isolation layer 520, in accordance with some embodiments. The isolation layer 520 is made of oxide (such as silicon dioxide) or another suitable insulating material, in accordance with some embodiments.

The semiconductor wire 530 is formed over the fin structure 514, in accordance with some embodiments. The semiconductor wire 530 is spaced apart from the fin structure 514, in accordance with some embodiments. The semiconductor wire 530 is made of an elementary semiconductor material including silicon or germanium in a single crystal, polycrystal, or amorphous structure. In some other embodiments, the semiconductor wire 530 is made of a compound semiconductor, such as silicon carbide, gallium arsenide, gallium phosphide, indium phosphide, indium arsenide, an alloy semiconductor, such as SiGe, or GaAsP, or a combination thereof.

The spacer layer 540 is formed over the semiconductor wire 530, the fin structure 514, and the isolation layer 520, in accordance with some embodiments. The spacer layer 540 has a trench 542, in accordance with some embodiments. The trench 542 partially exposes the semiconductor wire 530 and the fin structure 514, in accordance with some embodiments.

The spacer layer 540 is made of an insulating material such as silicon nitride, silicon dioxide, silicon oxynitride, or silicon carbide, in accordance with some embodiments. The spacer layer 540 may include a single layer or multiple layers. The spacer layer 540 is in direct contact with the semiconductor wire 530, the fin structure 514, and the isolation layer 520, in accordance with some embodiments.

The stressors 550 are formed over the fin structure 514, in accordance with some embodiments. The stressors 550 are positioned on opposite sides of the semiconductor wire 530 and on opposite sides of the fin structure 514, in accordance with some embodiments. The stressors 550 are in direct contact with the semiconductor wire 530 and the fin structure 514, in accordance with some embodiments. The stressors 550 include a source structure and a drain structure.

In some embodiments, the stressors 550 are made of a semiconductor material (e.g., silicon) with N-type dopants, such as the Group VA element, in accordance with some embodiments. The Group VA element includes phosphor (P), antimony (Sb), or another suitable Group VA material.

In some other embodiments, the stressors 550 are made of a semiconductor material (e.g., silicon germanium) with P-type dopants, such as the Group IIIA element, in accordance with some embodiments. The Group IIIA element includes boron or another suitable material. The stressors 550 are formed using an epitaxial process, in accordance with some embodiments.

The insulating layer 560 is formed over the stressors 550 and the isolation layer 520, in accordance with some embodiments. The insulating layer 560 includes an oxide-containing material such as silicon oxide, in accordance with some embodiments.

Figure 6B:
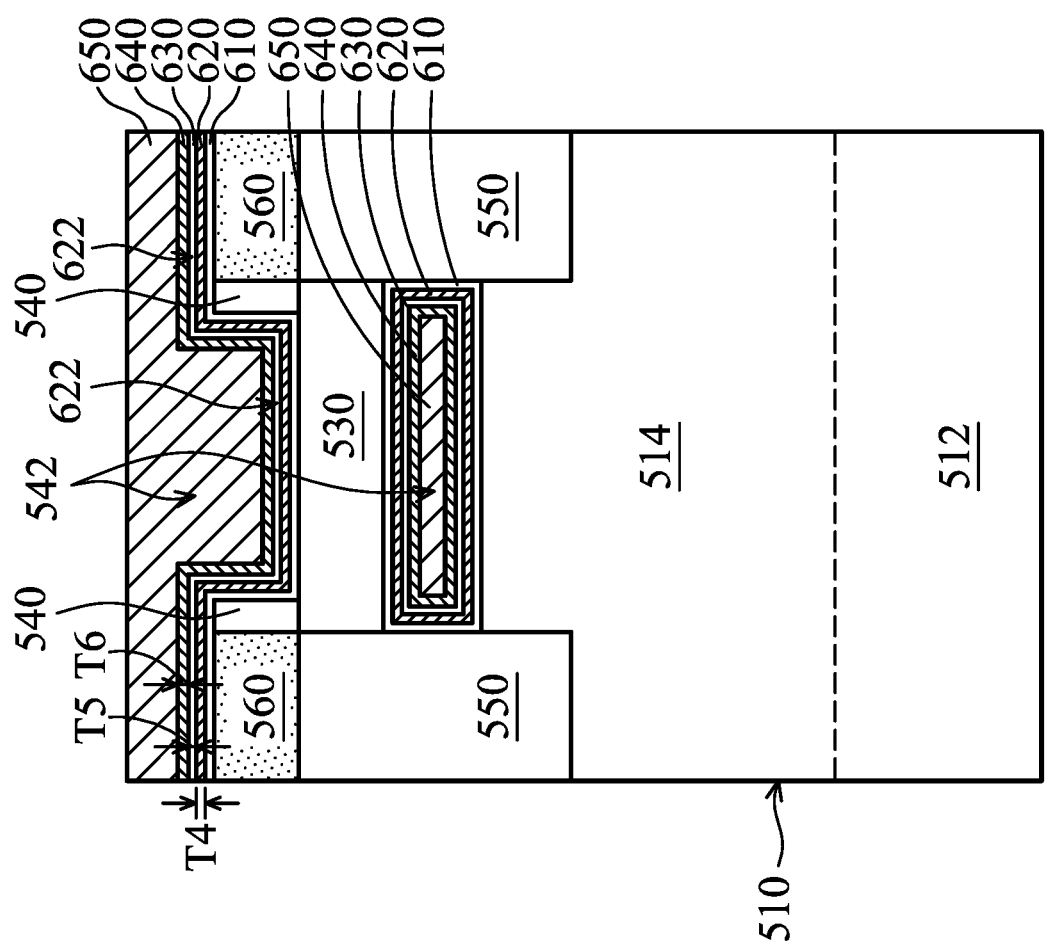
Figure 6C:
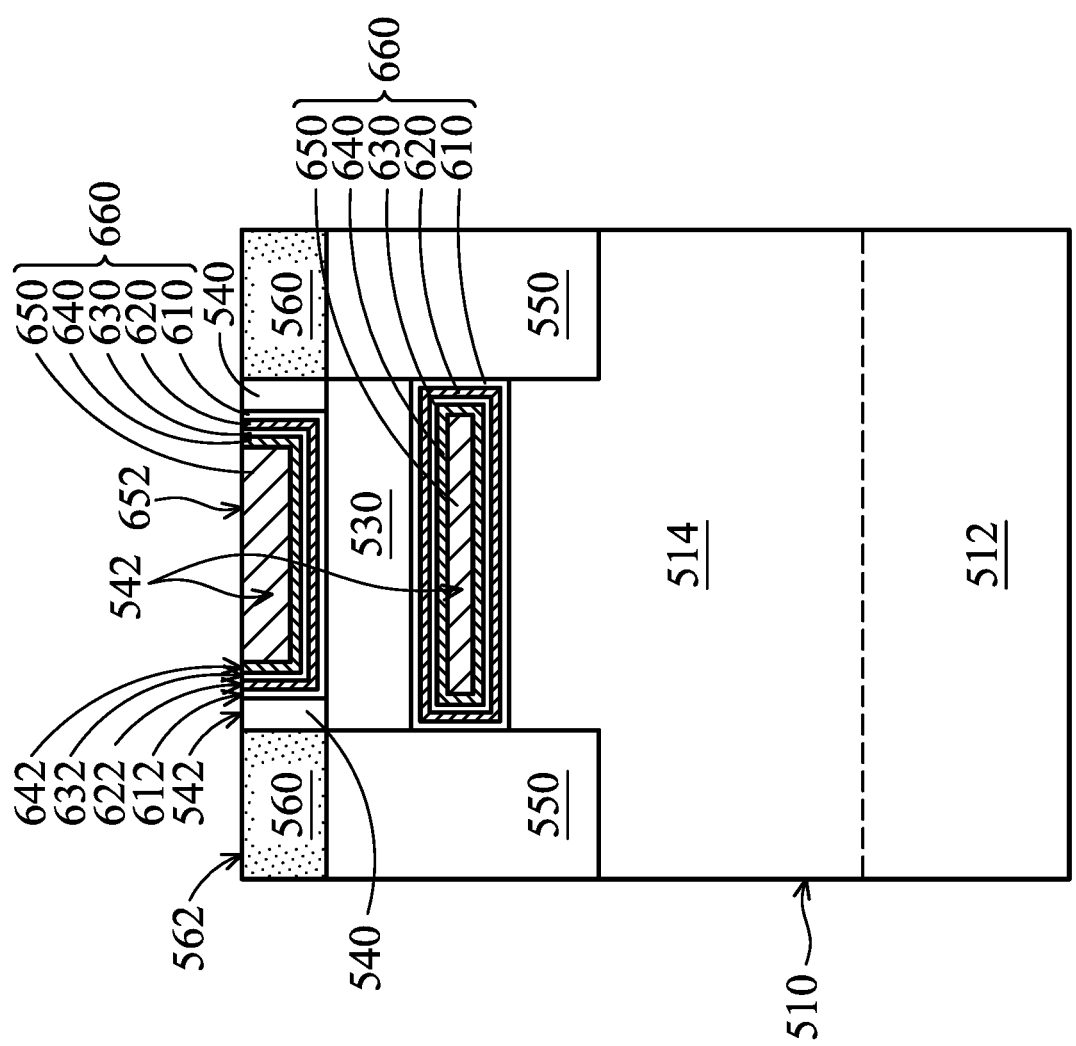

FIGS. 6A-6C are cross-sectional views of various stages of a process for forming a semiconductor device structure, in accordance with some embodiments. After the step of FIG. 6A, as shown in FIG. 6B, a gate dielectric layer 610 is formed in the trench 542 and over the fin structure 514 and the semiconductor wire 530 exposed by the trench 542, in accordance with some embodiments. The gate dielectric layer 610 conformally covers the spacer layer 540, the insulating layer 560, the fin structure 514, and the semiconductor wire 530, in accordance with some embodiments.

In some embodiments, a dielectric constant of the gate dielectric layer 610 is greater than a dielectric constant of silicon dioxide. The gate dielectric layer 610 is also referred to as a high dielectric-constant (high-k) layer, in accordance with some embodiments.

The gate dielectric layer 610 is made of a high-k dielectric material, such as hafnium dioxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

The formation of the gate dielectric layer 610 includes conformally depositing the gate dielectric layer 610 over the spacer layer 540, the insulating layer 560, the fin structure 514, and the semiconductor wire 530, in accordance with some embodiments. The deposition process includes a chemical vapor deposition process, an atomic layer deposition (ALD) process, or a physical vapor deposition process, in accordance with some embodiments.

In some other embodiments (not shown), an interfacial layer is formed over the fin structure 514 and the semiconductor wire 530 before the formation of the gate dielectric layer 610 to improve the adhesion between the gate dielectric layer 610 and the fin structure 514 and between the gate dielectric layer 610 and the semiconductor wire 530. The interfacial layer is made of an oxide-containing material such as silicon oxide, in accordance with some embodiments.

Thereafter, as shown in FIG. 6B, a work function metal layer 620 is formed over the gate dielectric layer 610, in accordance with some embodiments. The work function metal layer 620 is also referred to as a metal-containing layer, in accordance with some embodiments. The work function metal layer 620 provides a desired work function for a transistor to enhance device performance including improved threshold voltage.

In the embodiments of forming a PMOS transistor, the work function metal layer 620 is used to provide a work function value suitable for the device, such as equal to or greater than about 4.8 eV. The work function metal layer 620 may be made of metal, metal carbide, metal nitride, other suitable materials, or a combination thereof. For example, the work function metal layer 620 is made of titanium, titanium nitride, other suitable materials, or a combination thereof.

In the embodiments of forming an NMOS transistor, the work function metal layer 620 is used to provide a work function value suitable for the device, such as equal to or less than about 4.5 eV. The work function metal layer 620 may be made of metal, metal carbide, metal nitride, or a combination thereof. For example, the work function metal layer 620 is made of tantalum, tantalum nitride, or a combination thereof.

The work function metal layer 620 is formed using a deposition process, in accordance with some embodiments. The deposition process includes an atomic layer deposition (ALD), a chemical vapor deposition (CVD) process, another suitable method, or a combination thereof. The deposition process is performed in a chamber (not shown), in accordance with some embodiments. The chamber includes an atomic layer deposition chamber or a chemical vapor deposition chamber, in accordance with some embodiments.

Afterwards, as shown in FIG. 6B, a silicon-containing layer 630 is formed over the work function metal layer 620, in accordance with some embodiments. The silicon-containing layer 630 is conformally deposited over the work function metal layer 620, in accordance with some embodiments. The silicon-containing layer 630 continuously covers an entire top surface 622 of the work function metal layer 620, in accordance with some embodiments.

The silicon-containing layer 630 is thinner than the work function metal layer 620, in accordance with some embodiments. The work function metal layer 620 has a thickness T4 ranging from about 20 Å to about 50 Å, in accordance with some embodiments. The silicon-containing layer 630 has a thickness T5 ranging from about 3 Å to about 20 Å, in accordance with some embodiments.

The silicon-containing layer 630 is made of silicon oxide such as silicon dioxide, in accordance with some embodiments. The formation of the silicon-containing layer 630 includes forming a silicon layer over the work function metal layer 620; and oxidizing the silicon layer, in accordance with some embodiments. The silicon layer is formed using a soaking process, in accordance with some embodiments.

During the soaking process, the work function metal layer 620 is soaked in a silicon-containing compound (e.g., a silicon-containing gas), in accordance with some embodiments. In some embodiments, the soaking process is performed by providing the silicon-containing compound in the chamber (used to form the work function metal layer 620) and on the work function metal layer 620. The silicon-containing layer 630 and the work function metal layer 620 are formed in the same chamber, in accordance with some embodiments.

The silicon layer is oxidized by oxygen in the chamber and/or environmental oxygen, in accordance with some embodiments. The silicon-containing compound is represented by formula $Si_nH_{2n+2}$, and n is an integer from 1 to 10, in accordance with some embodiments. That is, the silicon-containing compound is $SiH_4$, $Si_2H_6$, $Si_3H_8$, or the like, in accordance with some embodiments.

Since the silicon-containing layer 630 and the work function metal layer 620 are formed in the same chamber, the silicon-containing layer 630 is able to protect the work function metal layer 620 thereunder from environmental oxygen (i.e., oxygen outside of the chamber). Therefore, the work function metal layer 620 is prevented from oxidation, and the electrical resistance of the work function metal layer 620 is prevented from being increased. As a result, the performance of a transistor with the work function metal layer 620 and the silicon-containing layer 630 is improved, in accordance with some embodiments.

As shown in FIG. 6B, a work function metal layer 640 is deposited over the silicon-containing layer 630, in accordance with some embodiments. The silicon-containing layer 630 is thinner than the work function metal layer 640, in accordance with some embodiments. The work function metal layer 640 has a thickness T6 ranging from about 20 Å to about 50 Å, in accordance with some embodiments.

In the embodiments of forming a PMOS transistor, the work function metal layer 640 is used to provide a work function value suitable for the device, such as equal to or greater than about 4.8 eV. The work function metal layer 640 may be made of metal, metal carbide, metal nitride, other suitable materials, or a combination thereof. For example, the work function metal layer 640 is made of titanium, titanium nitride ($Ti_3N_4$), other suitable materials, or a combination thereof.

In the embodiments of forming an NMOS transistor, the work function metal layer 640 is used to provide a work function value suitable for the device, such as equal to or less than about 4.5 eV. The work function metal layer 640 may be made of metal, metal carbide, metal nitride, or a combination thereof. For example, the work function metal layer 640 is made of tantalum, tantalum nitride, or a combination thereof.

The work function metal layer 640 is formed using an atomic layer deposition process, in accordance with some embodiments. The atomic layer deposition process uses a metal-containing compound (e.g., $TiCl_4$) as a precursor, in accordance with some embodiments. In some embodiments, a superficial portion of the silicon-containing layer 630 tends to have Si—OH bond, and the metal-containing compound tends to be bonded with Si—OH bond to convert Si—OH bond into Si—O—$TiCl_3$.

In some embodiments, the silicon-containing layer 630 has Si—O—Si bond, and the metal-containing compound tends to be bonded with Si—O—Si bond to convert Si—O—Si bond into Si—O—$TiCl_3$. Therefore, the silicon-containing layer 630 tends to bond with the metal-containing compound, in accordance with some embodiments. As a result, an incubation time of the atomic layer deposition process is reduced, in accordance with some embodiments. Therefore, the silicon-containing layer 630 improves the deposition speed and the deposition uniformity of the work function metal layer 640, in accordance with some embodiments. As a result, the silicon-containing layer 630 improves the thickness of the work function metal layer 640 as well, and the electrical resistance of a gate with the work function metal layer 640 is reduced, in accordance with some embodiments.

As shown in FIG. 6B, a gate electrode layer 650 is formed in the trench 542 and over the work function metal layer 640, in accordance with some embodiments. The gate electrode layer 650 is made of a suitable conductive material, such as metal (e.g., aluminum, tungsten, gold, platinum, or cobalt), an alloy thereof, or a combination thereof, in accordance with some embodiments. The gate electrode layer 650 is formed using a deposition process such as a physical vapor deposition (PVD) process, a chemical vapor deposition (CVD) process, or an atomic layer deposition (ALD) process, in accordance with some embodiments.

Figure 7:
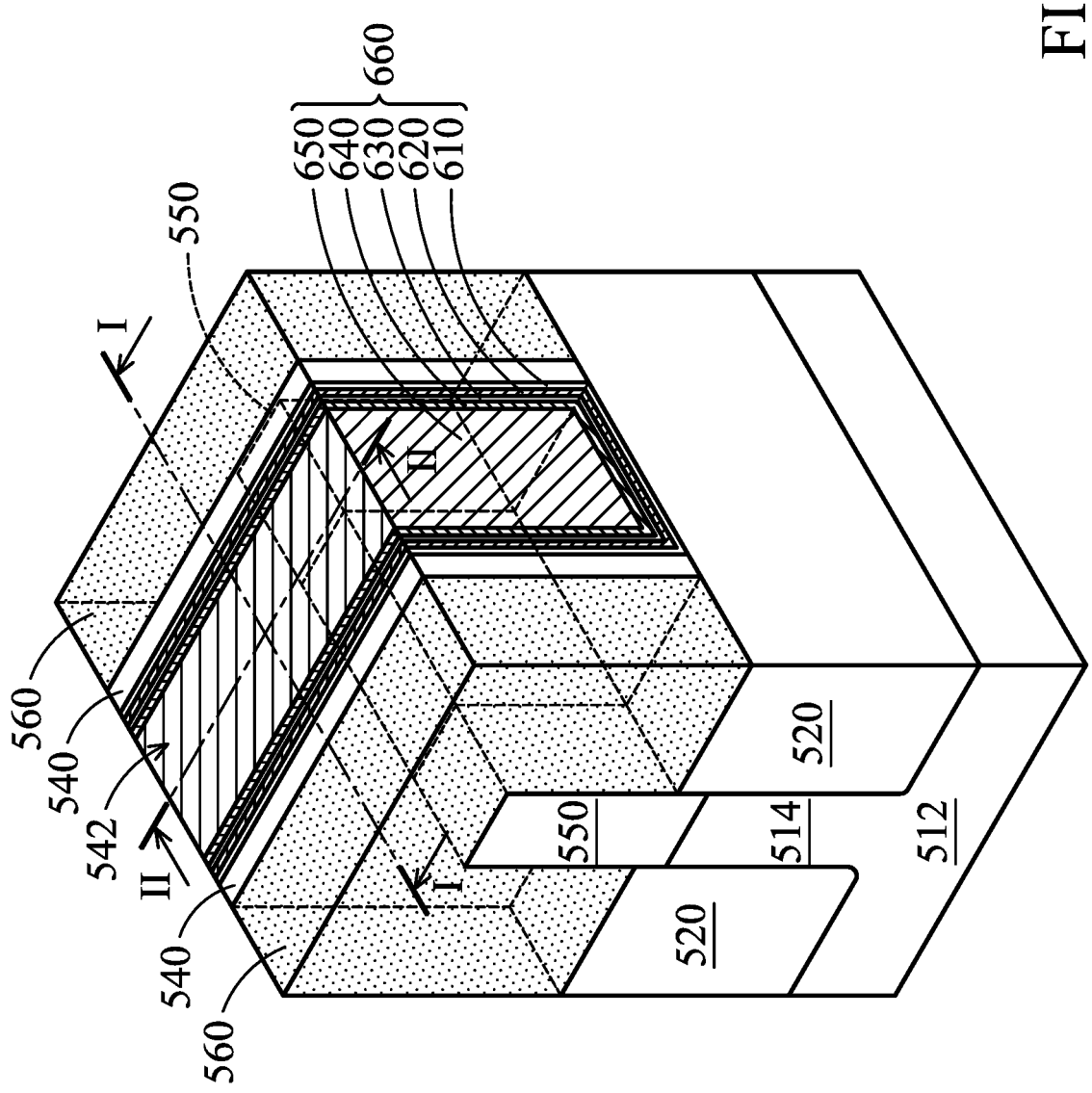
FIG. 7 is a perspective view of the semiconductor device structure of FIG. 6C, in accordance with some embodiments.
Figure 8:
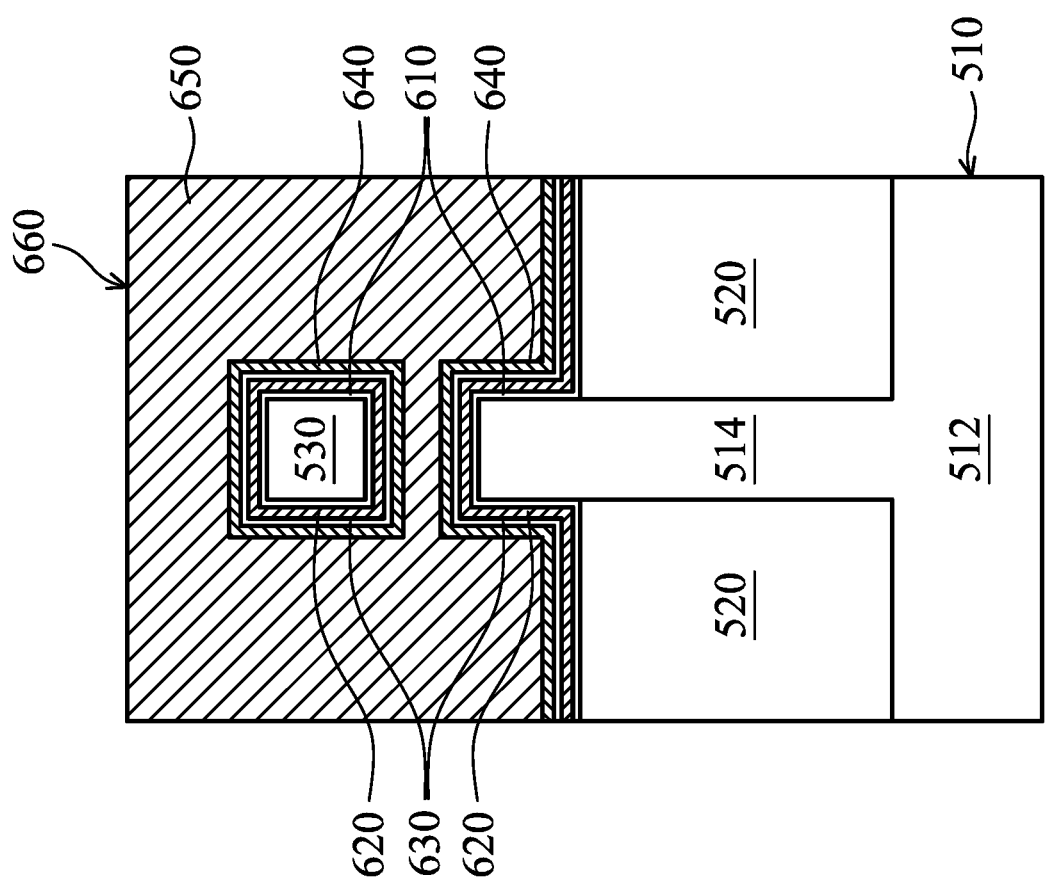
FIG. 8 is a cross-sectional view illustrating the semiconductor device structure along a sectional line II-II in FIG. 7, in accordance with some embodiments.

FIG. 7 is a perspective view of the semiconductor device structure of FIG. 6C, in accordance with some embodiments. FIG. 6C is a cross-sectional view illustrating the semiconductor device structure along a sectional line I-I in FIG. 7, in accordance with some embodiments. FIG. 8 is a cross-sectional view illustrating the semiconductor device structure along a sectional line II-II in FIG. 7, in accordance with some embodiments.

As shown in FIGS. 6C and 7, the gate dielectric layer 610, the work function metal layer 620, the silicon-containing layer 630, the work function metal layer 640, and the gate electrode layer 650 outside of the trench 542 are removed, in accordance with some embodiments. The top surfaces 612, 622, 632, 642, 652, 542, and 562 of the gate dielectric layer 610, the work function metal layer 620, the silicon-containing layer 630, the work function metal layer 640, the gate electrode layer 650, the spacer layer 540, and the insulating layer 560 are substantially coplanar, in accordance with some embodiments. As shown in FIG. 8, the gate dielectric layer 610, the work function metal layer 620, the silicon-containing layer 630, the work function metal layer 640, and the gate electrode layer 650 surround the semiconductor wire 530, in accordance with some embodiments.

The gate dielectric layer 610, the work function metal layer 620, the silicon-containing layer 630, the work function metal layer 640, and the gate electrode layer 650 remaining in the trench 542 together form a gate stack 660, in accordance with some embodiments. The semiconductor wire 530 laterally passes through the gate stack 660, in accordance with some embodiments. The gate stack 660 and the stressors 550 (including a source structure and a drain structure) together form a transistor, in accordance with some embodiments. The removal process includes a planarization process such as a chemical mechanical polishing (CMP) process, in accordance with some embodiments.

In accordance with some embodiments, semiconductor device structures and methods for forming the same are provided. The methods (for forming the semiconductor device structure) include forming a silicon-containing layer; and forming a metal-containing layer over the silicon-containing layer. The silicon-containing layer is able to improve the deposition speed and the deposition uniformity of the metal-containing layer.

In accordance with some embodiments, a method for forming a semiconductor device structure is provided. The method includes providing a substrate and an insulating layer over the substrate. The insulating layer has a trench partially exposing the substrate. The method includes forming a gate dielectric layer in the trench. The method includes forming a first metal-containing layer over the gate dielectric layer. The method includes forming a silicon-containing layer over the first metal-containing layer. The method includes forming a second metal-containing layer over the silicon-containing layer. The method includes forming a gate electrode layer in the trench and over the second metal-containing layer.

In accordance with some embodiments, a method for forming a semiconductor device structure is provided. The method includes providing a substrate, a gate stack, a source/drain structure and an insulating layer. The gate stack is over the substrate, the source/drain structure is in the substrate and adjacent to the gate stack, and the insulating layer is over the substrate and the source/drain structure. The method includes forming a through hole in the insulating layer and exposing the source/drain structure. The method includes forming a silicon-containing layer in the through hole to cover the source/drain structure and an inner wall of the through hole. The method includes forming a barrier layer in the through hole and over the silicon-containing layer. The method includes forming a metal-containing layer in the through hole and over the barrier layer.

In accordance with some embodiments, a semiconductor device structure is provided. The semiconductor device structure includes a substrate. The semiconductor device structure includes a gate stack over the substrate. The gate stack comprises a gate dielectric layer, a first metal-containing layer, a first silicon-containing layer, a second metal-containing layer, and a gate electrode layer sequentially stacked over the substrate, and the first silicon-containing layer is between the first metal-containing layer and the second metal-containing layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    providing a substrate and an insulating layer over the substrate, wherein the insulating layer has a trench partially exposing the substrate;
    forming a gate dielectric layer in the trench;
    forming a first metal-containing layer over the gate dielectric layer;
    forming a silicon-containing layer over the first metal-containing layer, wherein the silicon-containing layer is thinner than the first metal-containing layer;
    forming a second metal-containing layer over the silicon-containing layer; and
    forming a gate electrode layer in the trench and over the second metal-containing layer.

2. The method for forming the semiconductor device structure as claimed in claim 1, wherein the silicon-containing layer is made of silicon oxide.

3. The method for forming the semiconductor device structure as claimed in claim 1, wherein the forming of the silicon-containing layer over the first metal-containing layer comprises:
    forming a silicon layer over the first metal-containing layer; and
    oxidizing the silicon layer.

4. The method for forming the semiconductor device structure as claimed in claim 3, wherein the forming of the silicon layer over the first metal-containing layer comprises:
    applying a silicon-containing compound on the first metal-containing layer, wherein the applying of the silicon-containing compound on the first metal-containing layer and the forming of the first metal-containing layer over the gate dielectric layer are performed in a same chamber.

5. The method for forming the semiconductor device structure as claimed in claim 4, wherein the silicon-containing compound is represented by formula $SinH2n+2$, and n is an integer from 1 to 10.

6. The method for forming the semiconductor device structure as claimed in claim 1, wherein the forming of the second metal-containing layer over the silicon-containing layer comprises:
    performing an atomic layer deposition process over the silicon-containing layer.

7. The method for forming the semiconductor device structure as claimed in claim 1, wherein the silicon-containing layer conformally covers the first metal-containing layer.

8. The method for forming the semiconductor device structure as claimed in claim 1, wherein the silicon-containing layer is thinner than the second metal-containing layer.

9. The method for forming the semiconductor device structure as claimed in claim 1, wherein the second metal-containing layer is made of titanium nitride.

10. A method for forming a semiconductor device structure, comprising:
    providing a substrate, a gate stack, a source/drain structure and an insulating layer, wherein the gate stack is over the substrate, the source/drain structure is in the substrate and adjacent to the gate stack, and the insulating layer is over the substrate and the source/drain structure;
    forming a through hole in the insulating layer and exposing the source/drain structure, wherein the through hole has a first inner wall and a second inner wall opposite to the first inner wall;
    forming a silicon-containing layer in the through hole to cover the source/drain structure and the first inner wall and the second inner wall of the through hole, wherein the silicon-containing layer continuously extends from the first inner wall to the second inner wall, and the silicon-containing layer has a substantially U shape in a cross-sectional view of the silicon-containing layer;
    forming a barrier layer in the through hole and over the silicon-containing layer; and
    forming a metal-containing layer in the through hole and over the barrier layer.

11. The method for forming the semiconductor device structure as claimed in claim 10, wherein the forming of the barrier layer in the through hole and over the silicon-containing layer comprises:
    performing an atomic layer deposition process over the silicon-containing layer.

12. The method for forming the semiconductor device structure as claimed in claim 10, wherein the silicon-containing layer continuously and conformally covers the first inner wall of the through hole, the source/drain structure, and the second inner wall of the through hole.

13. The method for forming the semiconductor device structure as claimed in claim 10, wherein the silicon-containing layer is made of silicon oxide.

14. The method for forming the semiconductor device structure as claimed in claim 10, wherein the silicon-containing layer surrounds the metal-containing layer and the barrier layer.

15. A semiconductor device structure, comprising:
    a substrate; and
    a gate stack over the substrate, wherein the gate stack comprises a gate dielectric layer, a first metal-containing layer, a first silicon-containing layer, a second metal-containing layer, and a gate electrode layer sequentially stacked over the substrate, the first silicon-containing layer is between the first metal-containing layer and the second metal-containing layer, and the first silicon-containing layer is thinner than the first metal-containing layer.

16. The semiconductor device structure as claimed in claim 15, further comprising:
    an insulating layer over the substrate and surrounding the gate stack.

17. The semiconductor device structure as claimed in claim 16, further comprising:
    a source/drain structure in the substrate and adjacent to the gate stack, wherein the insulating layer covers the source/drain structure; and
    a contact structure passing through the insulating layer and connected to the source/drain structure, wherein the contact structure comprises a second silicon-containing layer, a barrier layer, and a third metal-containing layer, the barrier layer is between the second silicon-containing layer and the third metal-containing layer, and the second silicon-containing layer is between the barrier layer and the insulating layer and between the barrier layer and the source/drain structure.

18. The semiconductor device structure as claimed in claim 17, wherein the barrier layer conformally covers the second silicon-containing layer.

19. The semiconductor device structure as claimed in claim 15, further comprising:
a semiconductor wire passing through the gate stack, wherein the first silicon-containing layer surrounds the semiconductor wire.

20. The semiconductor device structure as claimed in claim 15, wherein the first silicon-containing layer is thinner than the second metal-containing layer.

* * * * *